(12) United States Patent
Koyama et al.

(10) Patent No.: US 6,704,335 B1
(45) Date of Patent: Mar. 9, 2004

(54) LIGHT-EMITTING DEVICE

(75) Inventors: Tomoko Koyama, Suwa (JP); Takeo Kaneko, Misato-Mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/601,974

(22) PCT Filed: Dec. 17, 1999

(86) PCT No.: PCT/JP99/07100

§ 371 (c)(1),
(2), (4) Date: Aug. 22, 2000

(87) PCT Pub. No.: WO00/36664

PCT Pub. Date: Jun. 22, 2000

(30) Foreign Application Priority Data

| Dec. 17, 1998 | (JP) | 10-358613 |
| Dec. 29, 1998 | (JP) | 10-377149 |
| Dec. 29, 1998 | (JP) | 10-377150 |
| Dec. 29, 1998 | (JP) | 10-377151 |

(51) Int. Cl.$^7$ .................. H01L 29/12; H01S 3/08
(52) U.S. Cl. ............... 372/43; 372/96; 372/102; 257/43; 313/503; 313/504
(58) Field of Search ............ 372/43, 96, 102; 313/503, 504; 257/40

(56) References Cited

U.S. PATENT DOCUMENTS

| 4,980,895 A | 12/1990 | Nishimura |
| 5,452,318 A | 9/1995 | Makino et al. |

(List continued on next page.)

FOREIGN PATENT DOCUMENTS

| EP | 58158989 | 3/1982 |
| EP | 0 940 894 A2 | 9/1999 |

(List continued on next page.)

OTHER PUBLICATIONS

M. Nakamura et al., *CW Operation of Distributed–Feedback GaAs–GaAlAs Diode laser at temperatures up to 300 K*, Appl. Phys. Lett., vol. 27, No. 7, pp. 403–405.

M. D. McGehee et al., *Semiconducting Polymer Distributed Feedback Lasers*, American Institue of Physics, vol. 72, No. 13, pp. 1536–1538.

S. M. Sze, *Physics of Semiconductor Devices*, Semiconductor Laser Physics, pp. 713.

R. P. Stanley et al., *Impurity Modes In One–Dimensional Periodic Systems: The Transition from Photonic Band Gaps to Microcavities*, Physical Review, vol. 48, No. 3, pp. 2246–2250.

Hideki Hirayama et al., *Novel Radiation Pattern of Spontaneous Emission From Photonic Bandgap Crystal Cavity Laser*, Extended Abstracts of the 1996 International Conference on Solid State Devices and Materials, Yokohama, 1996, pp. 220–222.

(List continued on next page.)

*Primary Examiner*—George Eckert
*Assistant Examiner*—Joseph Nguyen
(74) *Attorney, Agent, or Firm*—Oliff & Berridge, PLC

(57) ABSTRACT

An edge-emitting type light-emitting device (11000, 14000) comprises an organic light-emitting layer (40), a pair of electrode layers (30) and (50) for applying an electric field to the organic light-emitting layer (40), and an optical waveguide which transmits light emitted from the organic light-emitting layer (40) to the edge. The optical waveguide comprises a core layer (20) mainly transmitting light, and cladding layers (10) and (60) having a refractive index lower than that of the ecore layer (20). The core layer (20) may be a layer different from the organic light-emitting layer (40) or may comprise the organic light-emitting layer. A grating (12) is formed in the core layer (20) or in the boundary area between the core layer (20) and the cladding layer (10). A light-emitting device (31000) may comprise an optical fibre section (200). Another embodiment (43000) may comprise a defect and a grating having a one-dimensional periodic refractive index distribution and constituting a photonic band gap.

37 Claims, 17 Drawing Sheets

U.S. PATENT DOCUMENTS

| | | | |
|---|---|---|---|
| 5,673,284 A | | 9/1997 | Congdon et al. |
| 5,739,545 A | * | 4/1998 | Guha et al. .................... 257/40 |
| 5,757,832 A | * | 5/1998 | Uchida ........................ 372/45 |
| 5,784,400 A | | 7/1998 | Joannopoulos et al. |
| 5,926,497 A | * | 7/1999 | Nitta et al. .................... 372/96 |
| 5,991,322 A | * | 11/1999 | Takiguchi et al. ............ 372/50 |
| 6,018,541 A | * | 1/2000 | Huang ........................ 372/50 |

FOREIGN PATENT DOCUMENTS

| | | | |
|---|---|---|---|
| JP | 61-242090 | * | 10/1986 |
| JP | A-63-70257 | | 3/1988 |
| JP | A-63-175860 | | 7/1988 |
| JP | A-1-221741 | | 9/1989 |
| JP | A-2-51101 | | 2/1990 |
| JP | A-2-135359 | | 5/1990 |
| JP | A-2-135361 | | 5/1990 |
| JP | A-3-152184 | | 6/1991 |
| JP | A-5-32523 | | 2/1993 |
| JP | A-5-39480 | | 2/1993 |
| JP | A-5-273427 | | 10/1993 |
| JP | A-5-297202 | | 11/1993 |
| JP | A-6-201907 | | 7/1994 |
| JP | A-6-224115 | | 8/1994 |
| JP | A-7-20637 | | 1/1995 |
| JP | A-7-181689 | | 7/1995 |
| JP | A-7-235075 | | 9/1995 |
| JP | A-8-15506 | | 1/1996 |
| JP | A-8-248276 | | 9/1996 |
| JP | A-9-178901 | | 7/1997 |
| JP | A-9-211728 | | 8/1997 |
| JP | A-9-311238 | | 12/1997 |
| JP | A-10-8300 | | 1/1998 |
| JP | A-10-26702 | | 1/1998 |
| JP | A-10-59743 | | 3/1998 |
| JP | A-10-153967 | | 6/1998 |
| JP | A-2000-35504 | | 2/2000 |
| WO | WO 98/50989 | | 11/1998 |
| WO | WO 99/35721 | | 7/1999 |

OTHER PUBLICATIONS

M. Berggren et al., *Organic Lasers Based On Lithographically Defined Photonic–Bandgap Resonators*, Electronic Letters, vol. 34, No. 1, pp. 90.

Robert D. Meade et al., *Novel Applications of Photonic Band Gap Materials: Low–loss Bends and High Q Cavities*, J. Appl. Phys., pp. 4753–4755.

S. V. Frolov et al., *Cylindrical Microlasers and Light Emitting Devices from Conducting Polymers*, Applied Physics Letters, vol. 72, No. 22, pp. 2811–2813.

\* cited by examiner

LIGHT-EMITTING DEVICE

TECHNICAL FIELD

The present invention relates to a light-emitting device utilizing electroluminescence (EL).

BACKGROUND OF ART

Semiconductor lasers have been used as a light source for an optical communication system. Semiconductor lasers excel in wavelength selectivity and are capable of emitting light with a single mode. However, semiconductor lasers require many stages of crystal growth and are difficult to manufacture. Another problem with semiconductor lasers is the limitation to the types of light-emitting materials which can be used. This restricts the wavelength of light which can be emitted by semiconductor lasers.

Conventional EL light-emitting devices can emit light with a wavelength having a broad spectral width and have been applied to displays and the like. However, such EL light-emitting devices are unfit for application to optical communications and the like which require light with a narrow spectral width.

DISCLOSURE OF INVENTION

An object of the present invention is to provide a light-emitting device which can emit light with a wavelength having a remarkably narrow spectral width in comparison with conventional EL light-emitting devices, exhibits directivity, and can be applied to not only displays but also optical communications and the like.

A light-emitting device according to the present invention comprises:

a light-emitting layer being capable of emitting light by electroluminescence;

a pair of electrode layers for applying an electric field to the light-emitting layer; and an optical waveguide for transmitting light emitted from the light-emitting layer, wherein a grating is formed in the optical waveguide.

According to this light-emitting device, electrons and holes are introduced into the light-emitting layer respectively from the pair of electrode layers (cathode and anode). Light is emitted when the molecules return to the ground state from the excited state by recombination of the electrons and holes in the light-emitting layer. The light emitted from the light-emitting layer is provided with wavelength selectivity and directivity by the grating formed in the optical waveguide, specifically, a grating with alternating two medium layers each of which has a different refractive index arranged periodically.

It is preferable that the grating be a distributed feedback type or distributed Bragg reflection-type grating. Such a distributed feedback type or distributed Bragg reflection-type grating causes the light emitted from the light-emitting layer to resonate. As a result, light having wavelength selectivity, a narrow emission spectral width, and excellent directivity can be obtained. The pitch and depth of the grating are designed depending on the wavelength of the light to be emitted.

Light can be emitted with a single mode by providing the distributed feedback type grating with a $\lambda/4$ phase shifted structure or a gain-coupled structure. "$\lambda$" used herein indicates the wavelength of the light inside the optical waveguide.

A grating of a distributed feedback type having a $\lambda/4$ phase shifted structure or a gain-coupled structure is a preferable configuration common to the light-emitting devices of the present invention. It is sufficient for the grating to achieve the above functions. The grating may be formed in any layers constituting the optical waveguide.

It is preferable that the light-emitting layer comprises organic light-emitting materials. Use of organic light-emitting materials expands selection of the materials and enables emission of light having various wavelengths in comparison with the case using a semiconductor or inorganic materials.

The aspects described below from (a) to (d) can be given as examples of such a light-emitting device.

(a) In a first aspect of the light-emitting device, the optical waveguide comprises a core layer mainly transmitting light, and a cladding layer having a refractive index lower than the refractive index of the core layer; and the core layer comprises a layer which is different from the light-emitting layer.

A feature of this light-emitting device is that the core layer, which the light transmits mainly, is formed from a layer different from the light-emitting layer. The core layer is preferably made from materials having a refractive index higher than that of the light-emitting layer. This refractive index relationship ensures efficient introduction of the light emitted from the light-emitting layer into the core layer. The grating may be formed in the core layer. The grating may be formed in the boundary area between the cladding layer and a layer in contact with the cladding layer such as the core layer.

In the case where the light-emitting layer is an organic light-emitting layer comprising organic materials, the core layer may serve not only as a light transmitting layer, but also as at least one of a hole transport layer, electron transport layer, transparent electrode layer, and the like. The cladding layer is designed to have a refractive index lower than that of the core layer. The cladding layer may serve not only as a layer for light confinement, but also as an electrode layer, substrate, hole transport layer, electron transport layer, and the like.

(b) In a second aspect of the light-emitting device, the optical waveguide comprises a core layer mainly transmitting light, and a cladding layer having a refractive index lower than the refractive index of the core layer; and the core layer comprises a layer including the light-emitting layer, and the grating is formed in the optical waveguide.

A feature of this light-emitting device is that the light-emitting layer is included in the core layer which is the main light transmitting layer. The grating may be formed in the core layer. The grating may also be formed in a boundary area between the cladding layer and a layer in contact with the cladding layer, such as the core layer. In this light-emitting device, the light-emitting layer may be formed continuously or discontinuously one after another.

In the case where the light-emitting layer is an organic light-emitting layer formed by organic light-emitting materials, the core layer may further comprise at least one of a hole transport layer, an electron transport layer, a transparent electrode layer, and the like. The cladding layer may be designed to have a refractive index lower than that of the core layer. The cladding layer may serve not only as a layer for light confinement, but also as an electrode layer, a substrate, an hole transport layer, an electron transport layer, and the like.

In the light-emitting device according to this aspect, the grating may be formed by the light-emitting layer and a layer in contact with the light-emitting layer. According to the device having such a configuration, light emitted from the light-emitting layer resonates directly by the grating in the region including the light-emitting layer. As a result, light is emitted with a selected wavelength and excellent directivity.

(c) The light-emitting device as a third aspect of the present invention comprises an optical fiber section formed in one body, wherein the optical fiber section comprises a core layer and a cladding layer, and wherein the optical waveguide is formed continuously with at least one of the core layer or the cladding layer of the optical fiber section.

In this light-emitting device, because at least either the core layer or the cladding layer of the optical fiber section is formed in one body waveguide, light having excellent wavelength selectivity and directivity can be emitted from the light-emitting layer in the optical waveguide and supplied to the transmission system with high efficiency.

In this light-emitting device, the light-emitting layer may be included in the optical waveguide. The optical waveguide may be either continuous with the core layer of the optical fiber section or formed separately while being optically connected. Furthermore, it is preferable that the optical waveguide comprises a core-layer-continuing portion which continues from the core layer of the optical fiber section. In the case where the optical waveguide comprises such a part, light output from the optical waveguide is transmitted to the optical fiber with high efficiency. Moreover, this highly efficient optical combination can be obtained without requiring a delicate optical adjustment.

(d) In a fourth aspect of the light-emitting device, the grating has a defect and a one-dimensional periodic refractive index distribution which constitutes a photonic band gap; and the defect is designed so that the energy level caused by the vacancy is within a specific emission spectrum.

According to this light-emitting device, electrons and holes are introduced into the light-emitting layer respectively from a pair of electrode layers (cathode and anode). Light is emitted when the molecules return to the ground state from the excited state by recombination of the electrons and holes in the light-emitting layer. At this time, light with a wavelength equivalent to the photonic band gap of the grating cannot be transmitted through the grating. Only the light with a wavelength equivalent to the energy level caused by the vacancy can be transmitted through the grating. Therefore, light with a remarkably narrow emission spectral width can be obtained with high efficiency by prescribing the width of the energy level caused by the vacancy.

A special feature of this aspect is in the structure of the grating. Specifically, the grating has the defect and the one-dimensional periodic refractive index distribution which constitutes the photonic band gap.

In this aspect, in order to confine the light and guide it in a certain direction, the grating is preferably formed in the optical waveguide comprising areas having either a high refractive index or low refractive index. For example, substrates, materials in contact with the grating or the air layer can function as the cladding layer.

In the light-emitting device according to this aspect, the light-emitting layer and the defect of the grating may have the following configuration.

(1) The light-emitting layer formed in the defect also functions as the defect.

(2) The light-emitting layer also functions as at least part of the defect and the grating.

(3) The light-emitting layer is formed in a region different from the defect.

In this aspect, the light-emitting layer is preferably comprises an organic light-emitting layer formed by organic material. Use of such an organic light-emitting layer is preferred to the photonic band gap using semiconductors due to the following reasons. A grating comprising an organic light-emitting layer which constitutes a photonic band gap is not affected by the irregular state of the boundary area of the light-emitting layer and impurities in comparison with the case of using semiconductors, whereby excellent characteristics from the photonic band gap can be obtained. Furthermore, in the case of forming a medium layer from an organic light-emitting layer, the manufacture becomes easy and a good periodic structure with a refractive index can be easily obtained, whereby superior characteristics from the photonic band gap can be obtained.

Some of the materials which can be used for forming each section of the light-emitting device according to the present invention will be illustrated below. These materials are only some of the conventional materials. Materials other than these materials can also be used.

(Light-emitting Layer)

Materials for the light-emitting layer are selected from conventional compounds to obtain light with a prescribed wavelength. Any of organic and inorganic compounds may be used as the materials for the light-emitting layer. It is preferable to use organic compounds from the viewpoint of a wide variety of compounds and film-formability.

As examples of such organic compounds, aromatic diamine derivatives (TPD), oxydiazole derivatives (PBD), oxydiazole dimers (OXD-8), distyrarylene derivatives (DSA), beryllium-benzoquinolinol complex (Bebq), triphenylamine derivatives (MTDATA), rubrene, quinacridone, triazole derivatives, polyphenylene, polyalkylfluorene, polyalkylthiophene, azomethine zinc complex, polyphyrin zinc complex, benzooxazole zinc complex, and phenanthroline europium complex which are disclosed in Japanese Patent Application Laid-open No. 10-153967 can be given.

Specific examples of materials for the organic light-emitting layer include compounds disclosed in Japanese Patent Application Laid-open No. 63-70257, No. 63-175860, No. 2-135361, No. 2-135359, No. 2-152184, No. 8-248276 and No. 10-153967. These compounds can be used either individually or in combinations of two or more.

As examples of inorganic compounds, ZnS:Mn (red region), ZnS:TbOF (green region), SrS:Cu, SrS:Ag, SrS:Ce (blue region), and the like can be given.

(Optical Waveguide)

The optical waveguide comprises a core layer and a cladding layer having a refractive index lower than that of the core layer. Conventional inorganic and organic materials can be used for the core layer and cladding layer.

Typical examples of inorganic materials include $TiO_2$, $TiO_2$—$SiO_2$ mixture, $ZnO$, $Nb_2O_5$, $Si_3N_4$, $Ta_2O_5$, $HfO_2$, and $ZrO_2$ disclosed in Japanese Patent Application Laid-open No. 5-273427.

Typical examples of organic materials include various conventional resins such as thermoplastic resins, thermosetting resins, and photocurable resins. These resins are appropriately selected depending on a method of forming layers and the like. For example, in the case of using a resin which can be cured by energy of at least either heat or light, commonly used exposure devices, baking ovens, hot plates, and the like can be utilized.

As examples of such materials, a UV-curable resin disclosed in Japanese Patent Application No. 10-279439 applied by the applicant of the present invention can be given. Acrylic resins are suitable as such a UV-curable resins. UV-curable acrylic resins having excellent transparency and capable of being cured in a short period of time can be produced using various commercially-available resins and photosensitizers.

As specific examples of basic components of such UV-curable acrylic resins, prepolymers, oligomers, and monomers can be given.

Examples of prepolymers or oligomers include acrylates such as epoxy acrylates, urethane acrylates, polyester acrylates, polyether acrylates, and spiroacetal-type acrylates, methacrylates such as epoxy methacrylates, urethane methacrylates, polyester methacrylates, and polyether methacrylates, and the like.

Examples of monomers include monofunctional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, and 1,3-butanediol acrylate, bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate, and polyfunctional monomers such as trimethylolpropane triacrylate, trimethylolpropane trimethacrylate, pentaerythritol triacrylate, and dipentaerythritol hexaacrylate.

The above examples of inorganic and organic materials are illustrated only in consideration of light confinement. In the case where at least one layer among the light-emitting layer, hole transport layer, electron transport layer, and electrode layer functions as the core layer or the cladding layer, materials constituting these layers can be employed as materials for forming the core layer or the cladding layer constituting the optical waveguide.

(Hole Transport Layer)

As materials for the hole transport layer which is optionally formed, materials conventionally used as hole injection materials for photoconductive materials or a hole injection layer for organic light-emitting devices can be selectively used. As the materials for the hole transport layer, any organic or inorganic materials which have a function of either hole introduction or electron barrier characteristics are used. Materials disclosed in Japanese patent Application Laid-open No. 248276/1996 can be given as specific examples of such materials.

(Electron Transport Layer)

Materials for the electron transport layer which is optionally formed are required to transport electrons introduced from the cathode to the organic light-emitting layer and can be selected from conventional materials. Materials disclosed in Japanese Patent Application Laid-open No. 248276/1996 can be given as specific examples of such substances.

(Electrode Layer)

As the cathode, electron injectable metals, alloys, electrically conductive compounds with a small work function (for example, 4 eV or less), or mixtures thereof can be used. Materials disclosed in Japanese Patent Application Laid-open No. 248276/1996 can be given as specific examples of such electrode materials.

As the anode, metals, alloys, electrically conductive compounds with a large work function (for example, 4 eV or more), or mixtures thereof can be used. In the case of using optically transparent materials as the anode, transparent conductive materials such as CuI, ITO, $SnO_2$, and ZnO can be used. In the case where transparency is not necessary, metals such as gold can be used.

In the present invention, the grating can be formed by conventional methods without specific limitations.

Typical examples of such methods are given below.

1) Lithographic Method

In this method, a positive or negative resist is irradiated with ultraviolet rays, X-rays, or the like. The resist layer is patterned by development to form a grating. As a patterning technology using a polymethyl methacrylate resist or a novolak resin resist, for example, technologies disclosed in Japanese Patent Applications Laid-open No. 6-224115 and No. 7-20637 can be given.

As a technology of patterning polyimide by photolithography, for example, technologies disclosed in Japanese Patent Applications Laid-open No. 7-181689 and No. 1-221741 can be given. Furthermore, Japanese Patent Application Laid-open No. 10-59743 discloses a technology of forming a grating of polymethyl methacrylate or titanium oxide on a glass substrate utilizing laser ablation.

2) Formation of Refractive Index Distribution by Irradiation

In this method, the optical waveguide section of the optical waveguide is irradiated with light having a wavelength which produces changes in the refractive index to periodically form areas having different refractive indices on the optical waveguide section, thereby forming a grating. As such a method, it is preferable to form a grating by forming a layer of polymers or polymer precursors and polymerizing part of the polymer layer by irradiation or the like to periodically form areas having a different refractive index. Such a technology is disclosed in Japanese Patent Applications Laid-open No. 9-311238, No. 9-178901, No. 8-15506, No. 5-297202, No. 5-32523, No. 5-39480, No. 9-211728, No. 10-26702, No. 10-8300, and No. 2-51101.

3) Stamping Method

A grating is formed by, for example, hot stamping using a thermoplastic resin (Japanese Patent Application Laid-open No. 6-201907), stamping using a UV curable resin (Japanese Patent Application Laid-open No. 10-279439), or stamping using an electron-beam curable resin (Japanese Patent Application Laid-open No. 7-235075).

4) Etching Method

A thin film is selectively patterned using lithography and etching technologies to form a grating.

Methods of forming a grating is described above. A grating consists of two areas each of which has a different refractive index. Such a grating can be formed by forming such two areas from two materials having different refractive indices, by partially modifying one material to form two areas having different refractive indices, and the like.

Each layer of the light-emitting device can be formed by a conventional method. For example, the light-emitting layer is formed by a suitable film-forming method depending on the materials. A vapor deposition method, spin coating method, LB method, ink jet method, and the like can be given as specific examples.

BEST MODE FOR CARRYING OUT THE INVENTION (A) Among the embodiments illustrated below, a first to a sixth embodiment relate to an edge-emitting type light-emitting device having a basic structure provided with a light-emitting layer and an optical waveguide having a grating.

The first to third embodiments illustrate the case where the light-emitting layer and a core layer which transmits light are formed as different layers.

(First Embodiment)

Figure 1A:
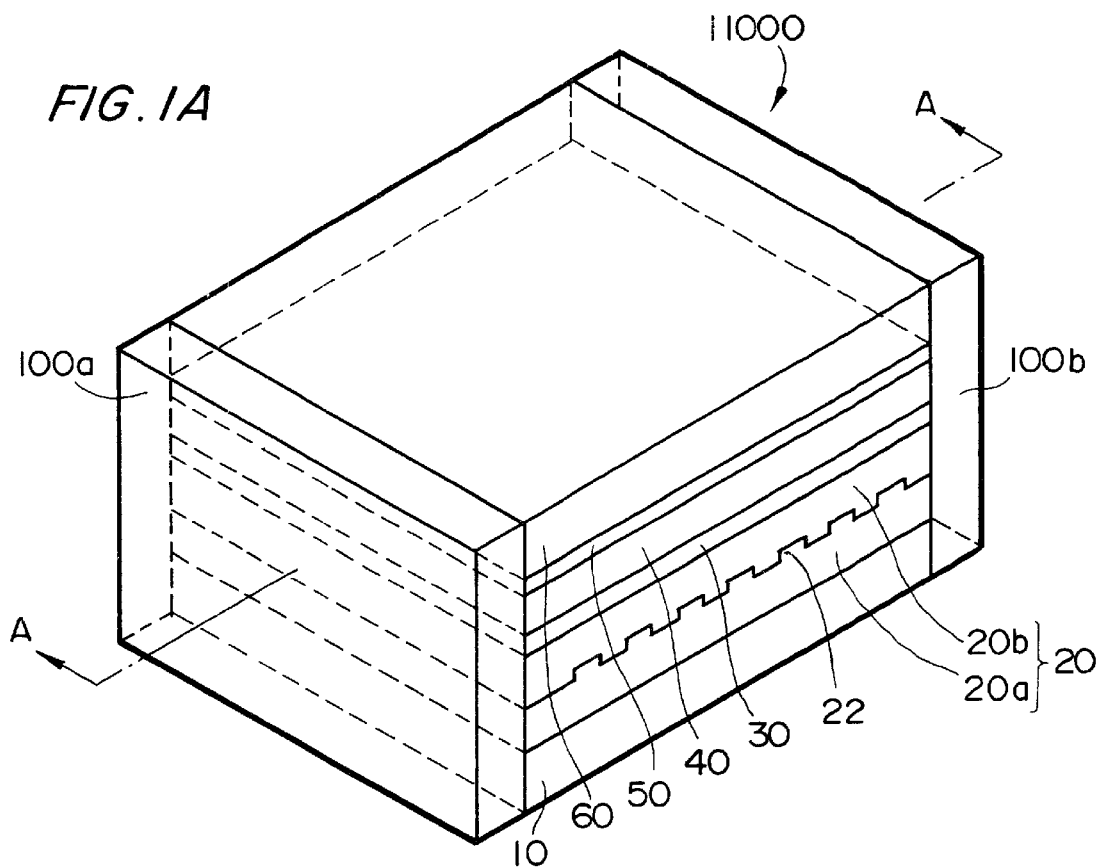
FIG. 1A is a schematic oblique view of an organic light-emitting device according to a first embodiment of the present invention.
Figure 1B:
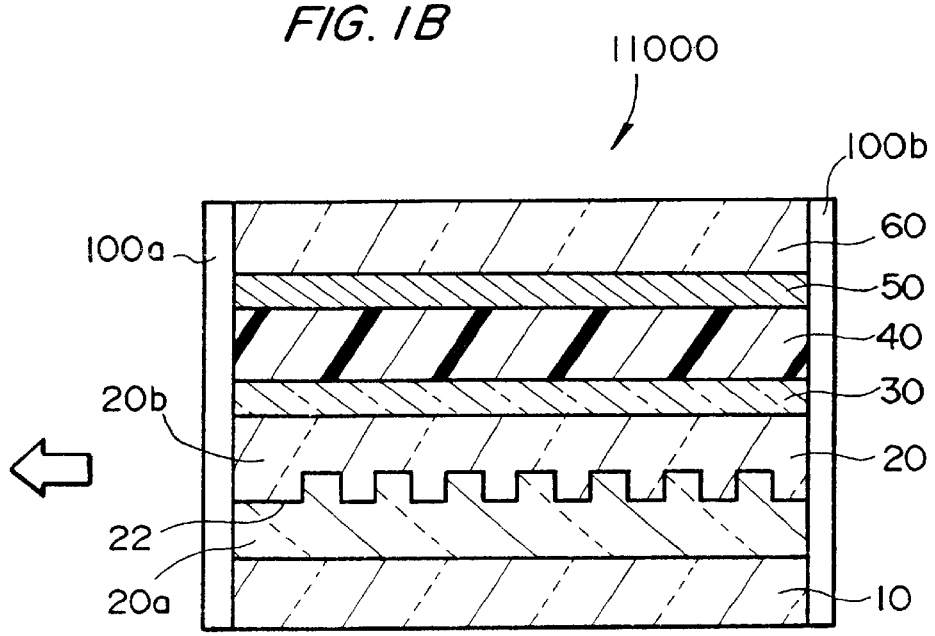
FIG. 1B is a cross-sectional view along the line A—A in FIG. 1A.

FIG. 1A is a schematic oblique view of an edge-emitting type light-emitting device 11000 (hereinafter referred to as "organic light-emitting device") according to the present embodiment. FIG. 1B is a cross-section viewed along the line A—A in FIG. 1A.

In the organic light-emitting device 11000, a first cladding layer 10, core layer 20, anode 30, organic light-emitting layer 40, cathode 50, and second cladding layer 60 are laminated in that order. The refractive indices of the first cladding layer 10 and the second cladding layer 60 in the organic light-emitting device 11000 are designed to be lower than the refractive index of each light transmitting layer existing between the first cladding layer 10 and the second cladding layer 60.

The core layer 20 which is the main light transmitting layer is formed along the organic light-emitting layer 40 through the anode 30. The core layer 20 comprises a first layer 20a and a second layer 20b each of which has a different refractive index. A grating 22 is formed in the boundary area between the first layer 20a and the second layer 20b.

The anode 30 is formed from conductive materials which transmit the light so that the light emitted from the organic light-emitting layer 40 is transmitted into the core layer 20. The materials mentioned above can be used as materials for this transparent electrode. It is preferable to design the anode 30 and the core layer 20 so that the refractive indices differ from the refractive index of the organic light-emitting layer 40, whereby the light emitted from the organic light-emitting layer 40 is efficiently introduced into the core layer 20.

The grating 22 is preferably a distributed feedback type grating. Such a distributed feedback type grating causes light to resonate inside the optical waveguide, thereby making it possible to obtain light exhibiting excellent wavelength selectivity and directivity with a narrow emission spectrum width. It is preferable that the grating 22 have a $\lambda/4$ phase shifted structure or a gain-coupled structure (not shown). Light with a single mode can be emitted more easily by the grating 22 having a $\lambda/4$ phase shifted structure or a gain-coupled structure.

A distributed feedback type grating is also preferable in the following second to fifth embodiments. Therefore, this will not be mentioned in the description of these embodiments.

In the organic light-emitting device 11000, a first coating layer 100a with a low reflectance is formed at one edge and a second coating layer 110b with a high reflectance is formed at the other edge. As these coating layers, for example, dielectric multi-layered mirrors commonly used in semiconductor DFB lasers can be used.

It is also preferable that a light-emitting device have such dielectric multi-layered mirrors in the following second to sixth embodiments. Therefore, this will not be mentioned in the description of these embodiments.

The action and the effect of the organic, light-emitting device 11000 will be described below.

Electrons and holes are injected into the organic light-emitting layer 40 respectively from the cathode 50 and the anode 30 by applying a prescribed voltage to both the anode 30 and the cathode 50. Excitons are formed in the organic light-emitting layer 40 by recombination of the electrons and holes. Light such as fluorescent light and phosphorescent light is emitted when these excitons are deactivated.

The light emitted from the organic light-emitting layer 40 is partially reflected by the cathode 50 or the second cladding layer 60. Part of the light is directly introduced into the core layer 20 through the anode 30 which consists of a transparent conductive layer. The light introduced into the core layer 20 is transmitted inside the core layer 20 toward the edge thereof by the distributed feedback type transmission because of the grating 22, and is emitted from the first low reflectance coating layer 100a.

The light is emitted through distributed feedback in the core layer 20 by the grating 22. Because of this, the emitted light has wavelength selectivity, a narrower emission spectrum width, and excellent directivity. Furthermore, light with a single mode can be obtained more easily by the grating 22 having a $\lambda/4$ phase shifted structure or a gain-coupled structure. "$\lambda$" used herein indicates the wavelength of the light inside the optical waveguide. The effect of the distributed feedback type grating is the same as in the following second to fifth embodiments. Therefore, this will not be mentioned in the description of these embodiments.

The second cladding layer 60 is formed outside the cathode 50 in the example shown in the figure. In the case where the cathode 50 can fully reflect the light emitted from the organic light-emitting layer 40, the second cladding layer 60 may be left out. This also applies to other embodiments having a similar structure.

In the example shown in the figure, the core layer 20 is formed between the first cladding layer 10 and the anode 30. The core layer 20 may be formed between the cathode 50 and the second cladding layer 60. For example, in the case where the cathode 50 is thin, the cathode 50 can transmit light emitted from the light-emitting layer 40. In this case, light with excellent wavelength selectivity and directivity can be emitted from the low reflectance first coating layer 100a by forming the core layer 20 having the grating 22 outside the cathode 50 in the same manner as in the above-described case. This modification also applies to other embodiments having a similar structure.

Either the first layer 20a or second layer 20b constituting the core layer 20 may be a gaseous layer such as air. In the case of forming a grating using such a gaseous layer, the difference in the refractive indices of the two medium layers constituting the grating can be wider while using conventional materials used for light-emitting devices. Therefore, a good grating which is efficient for a desired light wavelength can be obtained.

As a method for manufacturing the grating or organic light-emitting layer in the organic light-emitting device 11000 and materials constituting each layer, the methods and materials described above can be appropriately used. For example, in the formation of the grating 22 in the core layer 20, a comparatively simple stamping method and the like can be preferably used. These methods and materials also apply to the following embodiments.

(Second Embodiment)

Figure 2:
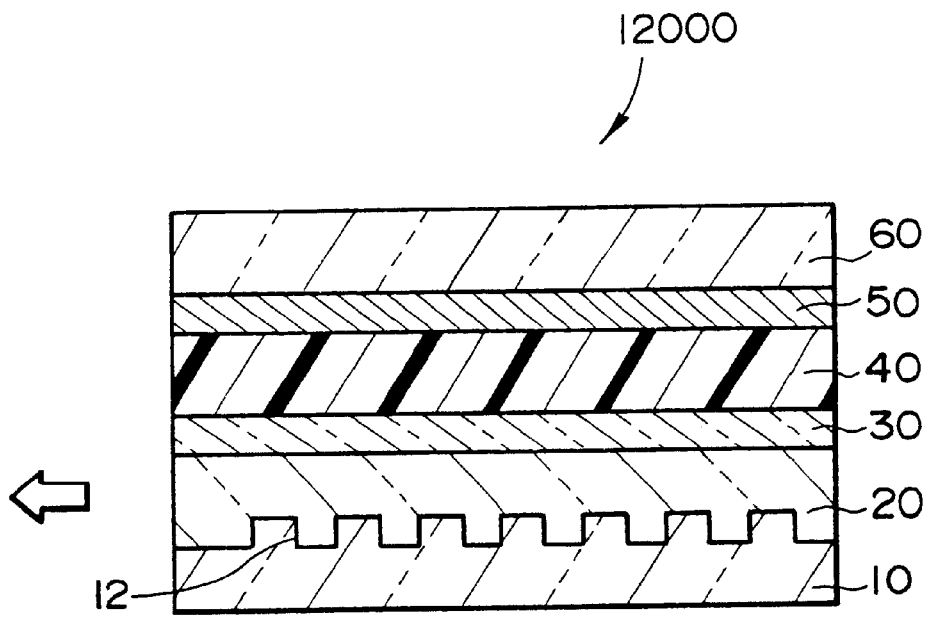
FIG. 2 is a cross-sectional view schematically showing an organic light-emitting device according to a second embodiment of the present invention.

FIG. 2 is a cross-sectional view schematically showing an organic light-emitting device 12000 according to the present embodiment. This organic light-emitting device 12000 forms the grating in the area different from the organic light-emitting device 11000 according to the first embodiment.

In the organic light-emitting device 12000, a first cladding layer 10, core layer 20, anode 30, organic light-emitting layer 40, cathode 50, and second cladding layer 60 are laminated in that order. The refractive indices of the first cladding layer 10 and the second cladding layer 60 in the organic light-emitting device 12000 are designed to be lower than the refractive index of each light transmitting layer existing between the first cladding layer 10 and the second cladding layer 60.

The light-transmitting core layer 20 is formed along the organic light-emitting layer 40 through the anode 30. A grating 12 is formed in the boundary area between the core layer 20 and the first cladding layer 10.

The anode 30 is formed from conductive materials which transmit light so that the light emitted from the organic light-emitting layer 40 is introduced into the core layer 20. The materials mentioned above can be used as materials for this transparent electrode. The anode 30 and the core layer 20 are preferably designed so that the refractive indices differ from the refractive index of the organic light-emitting layer 40 in order to efficiently introduce the light emitted from the organic light-emitting layer 40 into the core layer 20.

The action and the effect of the organic light-emitting device 12000 will be described below.

Electrons and holes are introduced into the organic light-emitting layer 40 respectively from the cathode 50 and the anode 30 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is partially reflected by the cathode 50 or the second cladding layer 60. Part of the light is directly introduced into the core layer 20 through the anode 30 which consists of a transparent conductive layer.

(Third Embodiment)

Figure 3:
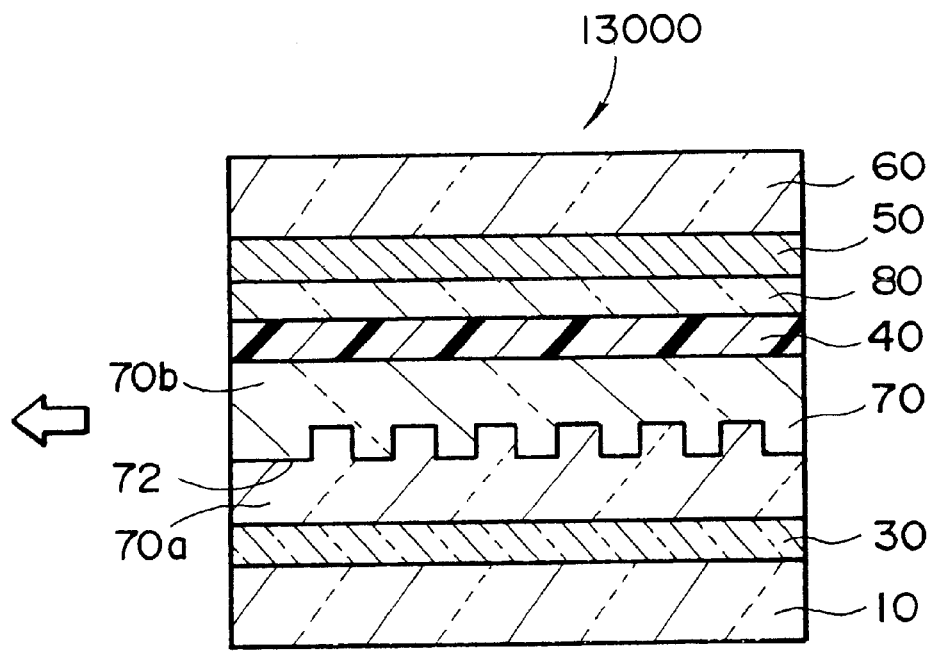
FIG. 3 is a cross-sectional view schematically showing an organic light-emitting device according to a third embodiment of the present invention.

FIG. 3 is a cross-sectional view schematically showing an organic light-emitting device 13000 according to a third embodiment. The organic light-emitting device 13000 differs from the organic light-emitting device 11000 of the first embodiment in having a hole transport layer and an electron transport layer.

In the organic light-emitting device 13000, a first cladding layer 10, anode 30, hole transport layer 70, organic light-emitting layer 40, electron transport layer 80, cathode 50, and second cladding layer 60 are laminated in that order. The refractive indices of the first cladding layer 10 and the second cladding layer 60 in the organic light-emitting device 13000 are designed to be lower than the refractive index of each light transmitting layer existing between the first cladding layer 10 and the second cladding layer 60.

The feature of this embodiment is that the hole transport layer 70 also functions as the core layer 20 in the first embodiment. Specifically, the hole transport layer 70 which functions as a core layer comprises a first layer 70a and a second layer 70b each having a different refractive index. A grating 72 is formed in the boundary area between the first layer 70a and the second layer 70b in the direction of light transmission.

It is preferable to design the hole transport layer 70 so that these refractive indices differ from the refractive index of the organic light-emitting layer 40 in order to efficiently introduce the light emitted from the organic light-emitting layer 40 into the hole transport layer 70.

The action and the effect of the organic light-emitting device 13000 will be described below.

Electrons are injected from the cathode 50 through the electron transport layer 80 and holes are introduced from the anode 30 through the hole transport layer 70 into the organic light-emitting layer 40 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is partially reflected by the cathode 50 or the second cladding layer 60. Part of the light is directly introduced into the hole transport layer 70. The light introduced into the hole transport layer 70 is transmitted inside a waveguide layer 74 toward the edge thereof by distributed feedback type transmission due to the grating 72. The light is emitted from a first coating layer with a low reflectance (not shown).

The embodiment illustrates the case of forming the grating 72 in the hole transport layer 70. The grating may be formed in the electron transport layer 80 instead of the hole transport layer 70. It is unnecessary to form both the hole transport layer and the electron transport layer. Either of these transport layers may be enough. This also applies to other embodiments.

The grating 72 is formed inside the hole transport layer 70 in this embodiment. A grating may be formed by the hole transport layer 70 and the anode 30 made of ITO and the like which is not a metal electrode.

The following fourth and fifth embodiments illustrate the case where the core layer comprises the organic light-emitting layer.

(Fourth Embodiment)

Figure 4:
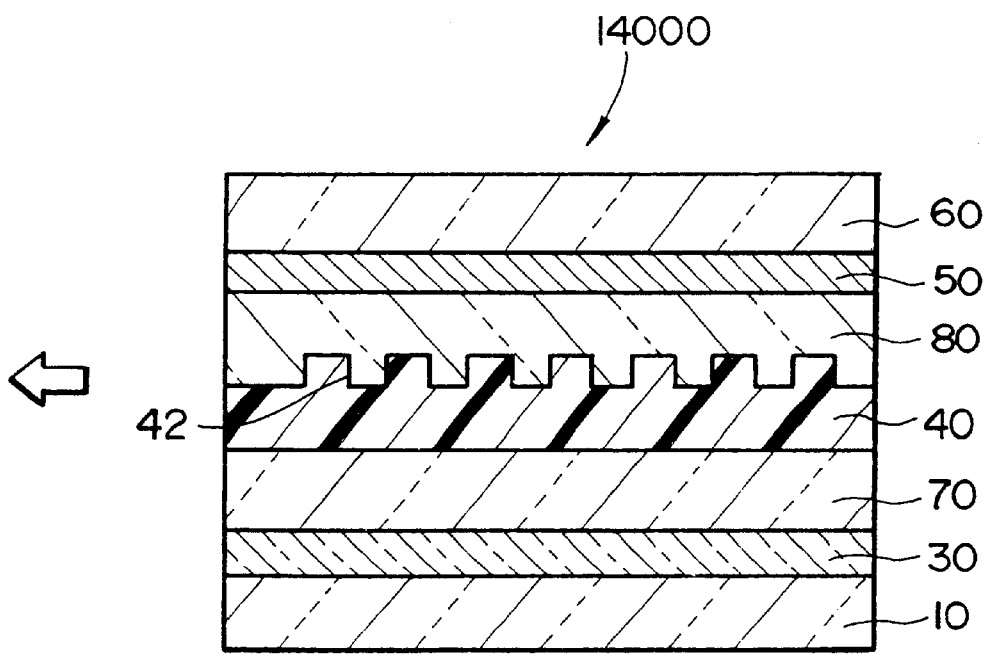
FIG. 4 is a cross-sectional view schematically showing an organic light-emitting device according to a fourth embodiment of the present invention.

FIG. 4 is a cross-sectional view schematically showing an organic light-emitting device 14000 according to the present embodiment.

A feature of this organic light-emitting device 14000 is that an organic light-emitting layer 40 is sandwiched between a hole transport layer 70 and a electron transport layer 80 and a grating is formed in the organic light-emitting layer 40.

In the organic light-emitting device 14000, a first cladding layer 10, anode 30, hole transport layer 70, organic light-emitting layer 40, electron transport layer 80, cathode 50, and second cladding layer 60 are laminated in that order. The refractive indices of the first cladding layer 10 and the second cladding layer 60 in the organic light-emitting device 14000 are designed to be lower than the refractive index of each light transmitting layer existing between the first cladding layer 10 and the second cladding layer 60.

In this embodiment, the organic light-emitting layer 40 and the electron transport layer 80 also function as a light-transmitting core layer. A grating 42 is formed in the boundary area between the organic light-emitting layer 40 and the electron transport layer 80. Therefore, the refractive indices of the organic light-emitting layer 40 and the electron transport layer 80 are designed to be different.

The action and the effect of the organic light-emitting device 14000 will be described below.

Electrons are injected from the cathode 50 through the electron transport layer 80 and holes are introduced from the anode 30 through the hole transport layer 70 into the organic light-emitting layer 40 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is transmitted inside the organic light-emitting layer 40 and the electron transport layer 80 toward the edges thereof by distributed feedback type transmission due to the grating 42. The light is emitted from a first coating layer with a low reflectance (not shown).

According to this organic light-emitting device 14000, because the light emitted from the organic light-emitting layer 40 is transmitted inside the organic light-emitting layer 40, efficient light emission is ensured by appropriately selecting the materials for the organic light-emitting layer 40.

The grating 42 is formed by the organic light-emitting layer 40 and the electron transport layer 80 in the organic light-emitting device 14000 of this embodiment. In the case of using a nonmetallic substance such as diamond as the material for the cathode 50, the grating may be formed by the cathode 50 and the electron transport layer 80. If the electron transport layer 80 is not formed, the grating may be formed by the cathode 50 and the organic light-emitting layer 40.

(Fifth Embodiment)

Figure 5:
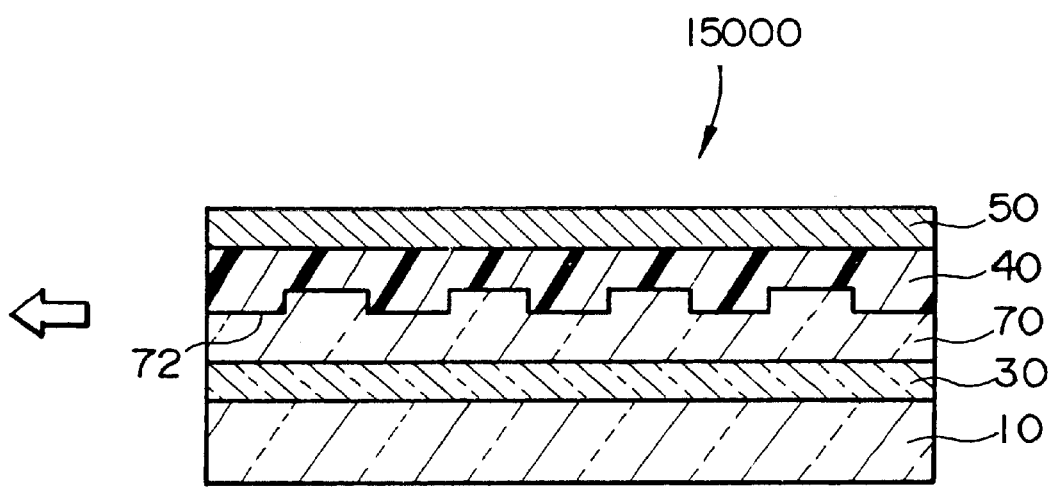
FIG. 5 is a cross-sectional view schematically showing an organic light-emitting device according to a fifth embodiment of the present invention.

FIG. 5 is a cross-sectional view schematically showing an organic light-emitting device 15000 according to the present embodiment. In this organic light-emitting device 15000, the organic light-emitting layer constitutes the grating as in the fourth embodiment. However, this organic light-emitting device does not have a second cladding layer.

In the organic light-emitting device 15000, a cladding layer 10, anode 30, hole transport layer 70, organic light-emitting layer 40, and cathode 50 are laminated in that order. A grating 72 is formed in the boundary area between the organic light-emitting layer 40 and the hole transport layer 70. Therefore, the refractive indices of the organic light-emitting layer 40 and the hole transport layer 70 are designed to be different.

In this organic light-emitting device 15000, the organic light-emitting layer 40 and hole transport layer 70 function as a core layer which transmits light.

The action and the effect of the organic light-emitting device 15000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is transmitted inside the organic light-emitting layer 40 and the hole transport layer 70 toward the edges thereof by distributed feedback type transmission due to the grating 72. The light is emitted from a first coating layer with a low reflectance (not shown).

According to this organic light-emitting device 15000, because part of the organic light-emitting layer 40 constitutes the grating 72, light is emitted with high efficiency by appropriately selecting the materials for the organic light-emitting layer 40.

(Sixth Embodiment)

Figure 6:
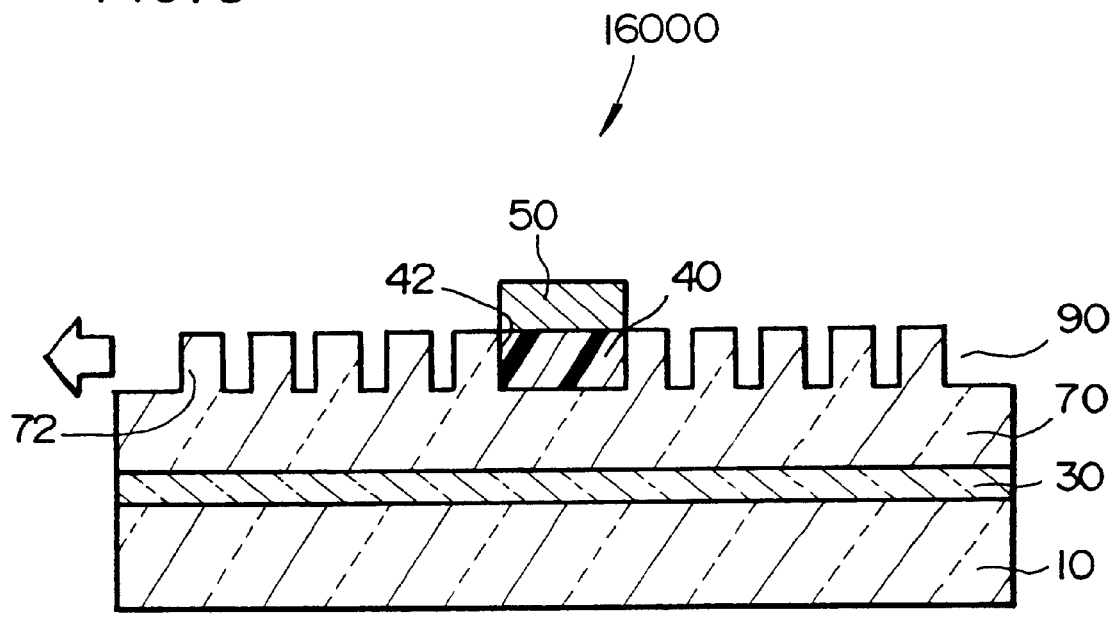
FIG. 6 is a cross-sectional view schematically showing an organic light-emitting device according to a sixth embodiment of the present invention.

FIG. 6 is a cross-sectional view schematically showing an organic light-emitting device 16000 according to the present embodiment. This organic light-emitting device 16000 differs from the above-described organic light-emitting devices in having a distributed Bragg reflection-type grating.

In the organic light-emitting device 16000, a cladding layer 10, anode 30, hole transport layer 70, organic light-emitting layer 40, and cathode 50 are laminated in that order. The refractive index of the cladding layer 10 in the organic light-emitting device 16000 is designed to be lower than the refractive index of each light-transmitting layer.

A grating 72 formed in the boundary area between the hole transport layer 70 and an air layer 90 constitutes a distributed Bragg-type grating having an air gap. A concavity 42 is formed in part of the surface of the hole transport layer 70. The organic light-emitting layer 40 is formed in the concavity 42. The cathode 50 is formed on the organic light-emitting layer 40. In the organic light-emitting device 16000, the hole transport layer 70 and the air layer 90 function as a light-transmitting core layer.

The distributed Bragg-type grating 72 causes light to resonate, whereby light with excellent wavelength selectivity and directivity can be obtained.

The action and the effect of the organic light-emitting device 16000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated.

Because this embodiment has the distributed Bragg reflection-type grating 72, light emitted from the organic light-emitting layer 40 is reflected by the grating at both sides of the organic light-emitting layer 40 and resonates. Therefore, the light emitted from the organic light-emitting layer 40 resonates more efficiently and is transmitted inside the hole transport layer 70 and the air layer 90 toward the edges thereof. The light is emitted from a first coating layer with a low reflectance (not shown). Because the light is emitted after resonating by the distributed Bragg reflection-type grating 72, the light not only has excellent wavelength selectivity and directivity but also is emitted with high efficiency.

The grating 72 is formed in the hole transport layer 70 in the example shown in the figure. The grating may be formed in an electron transport layer which is formed instead of the hole transport layer. A core layer may be formed from materials with small light absorption instead of forming the hole transport layer or electron transport layer. One of layers constituting gratings, which comprise air in the example shown in the figure, may be a layer formed from other materials. Furthermore, at least either the hole transport layer or the electron transport layer may be embedded into the concavity 42 in addition to the organic light-emitting layer 40.

Figure 7:
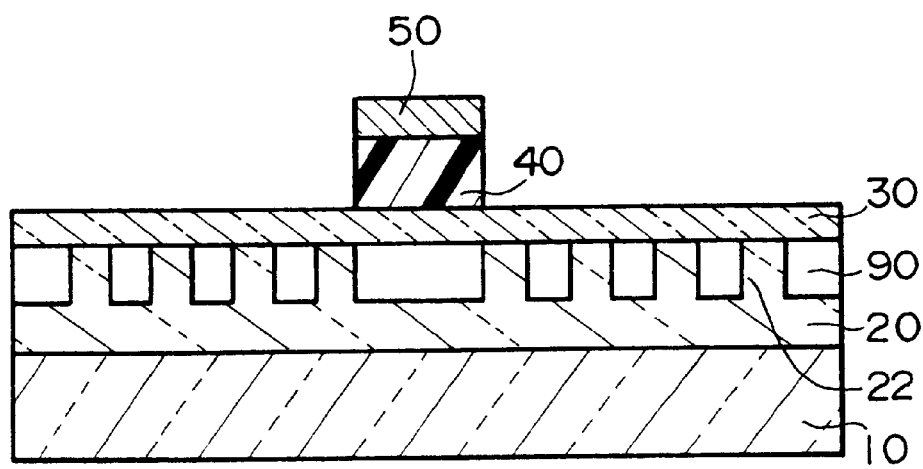
FIG. 7 is a cross-sectional view schematically showing modification of an organic light-emitting device according to a sixth embodiment of the present invention.

The grating is formed by the hole transport layer 70 on the anode 30 and the air layer 90 in the organic light-emitting device 16000 shown in FIG. 6. For example, a distributed Bragg reflection-type grating 22 shown in FIG. 7 may be formed using two medium layers each of which has a different refractive index (a core layer 20 and an air layer 90 in FIG. 7) below the anode 30.

(B) The following seventh to tenth embodiments illustrate examples in which a light-emitting layer constitutes a medium layer of a grating and the light-emitting layer is discontinuous.

(Seventh Embodiment)

Figure 8:
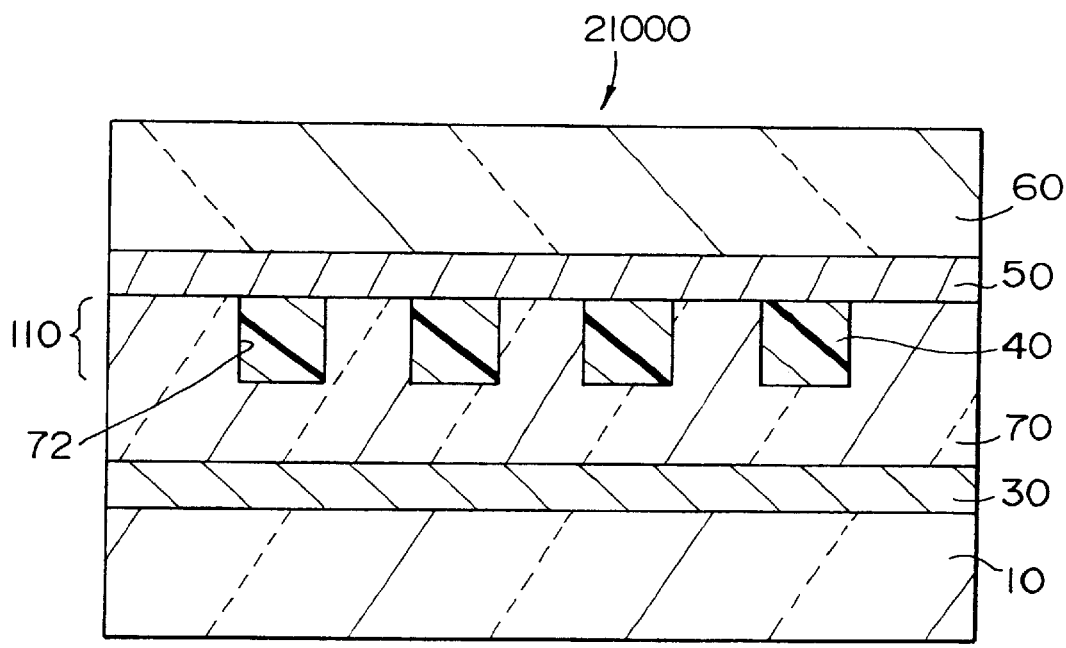
FIG. 8 is a cross-sectional view schematically showing an organic light-emitting device according to a seventh embodiment of the present invention.

FIG. 8 is a cross-sectional view schematically showing an edge-emitting type organic light-emitting device 21000 according to the present embodiment.

In the organic light-emitting device 21000, a first cladding layer 10, anode 30, hole transport layer 70, organic light-emitting layer 40, cathode 50, and second cladding layer 60 are laminated in that order. The refractive indices of the first cladding layer 10 and the second cladding layer 60 in the organic light-emitting device 21000 are designed to be lower than the refractive index of each light transmitting layer existing between the first cladding layer 10 and the second cladding layer 60. The organic light-emitting layer 40 is sandwiched between the hole transport layer 70 and the cathode 50.

In this embodiment, at least the organic light-emitting layer 40 and the hole transport layer 70 also function as a light-transmitting core layer. A grating 110 is formed by the organic light-emitting layer 40 and the hole transport layer 70. Therefore, the refractive indices of the organic light-emitting layer 40 and the hole transport layer 70 are designed to be different. Specifically, the grating 110 is formed by forming concavities 72 with a prescribed pitch and depth in the upper portion of the hole transport layer 70 and filling the organic light-emitting layer 40 therein. Therefore, the organic light-emitting layers 40 are separated at a prescribed pitch.

The grating 110 is preferably a distributed feedback type grating. Light having excellent wavelength selectivity, a narrow emission spectrum width, and superior directivity can be obtained by forming such a distributed feedback type grating. It is preferable that the grating 110 have a $\lambda/4$ phase shifted structure or a gain-coupled structure (not shown). Such a $\lambda/4$ phase shifted structure or a gain-coupled structure ensures that the light is emitted with a single mode.

A distributed feedback type grating is also preferable in the following eighth to tenth embodiments. Therefore, this will not be further mentioned in the description of these embodiments.

In the organic light-emitting device 21000, a first coating layer with a low reflectance is formed at one edge and a second coating layer with a high reflectance is formed at the other edge (not shown). As these coating layers, for example, dielectric multi-layered mirrors commonly used in semiconductor DFB lasers can be used.

It is also preferable that a light-emitting device have such dielectric multi-layered mirrors in the following eighth to tenth embodiments. Therefore, this will not be further mentioned in the description of these embodiments.

Although not shown in the figure showing the organic light-emitting device 21000, it is preferable to form an insulating layer on the surface of the convexities of the hole transport layer 70, in other words, between the hole transport layer 70 and the cathode 50 in the area where the light-emitting layers 40 are not formed. The current injection efficiency into the light-emitting layer 40 can be improved by forming such an insulating layer.

The action and the effect of the organic light-emitting device 21000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is transmitted inside a core layer toward the edge thereof by distributed feedback type transmission due to the grating 110. The light is emitted from the first coating layer with a low reflectance.

The light is emitted through distributed feedback by the grating 110. Because of this, the emitted light has wavelength selectivity, a narrower emission spectrum width, and excellent directivity. Furthermore, light with a single mode can be obtained more easily by the grating 110 having a λ/4 phase shifted structure or a gain-coupled structure. "λ" used herein indicates the wavelength of the light inside the optical waveguide. This also applies to the following eighth to tenth embodiments and will not be mentioned in the description of these embodiments.

According to this organic light-emitting device 21000, because the light emitted from the organic light-emitting layer 40 is transmitted inside the organic light-emitting layer 40, efficient light emission is ensured by appropriately selecting the materials for the organic light-emitting layer 40.

(Eighth Embodiment)

Figure 9:
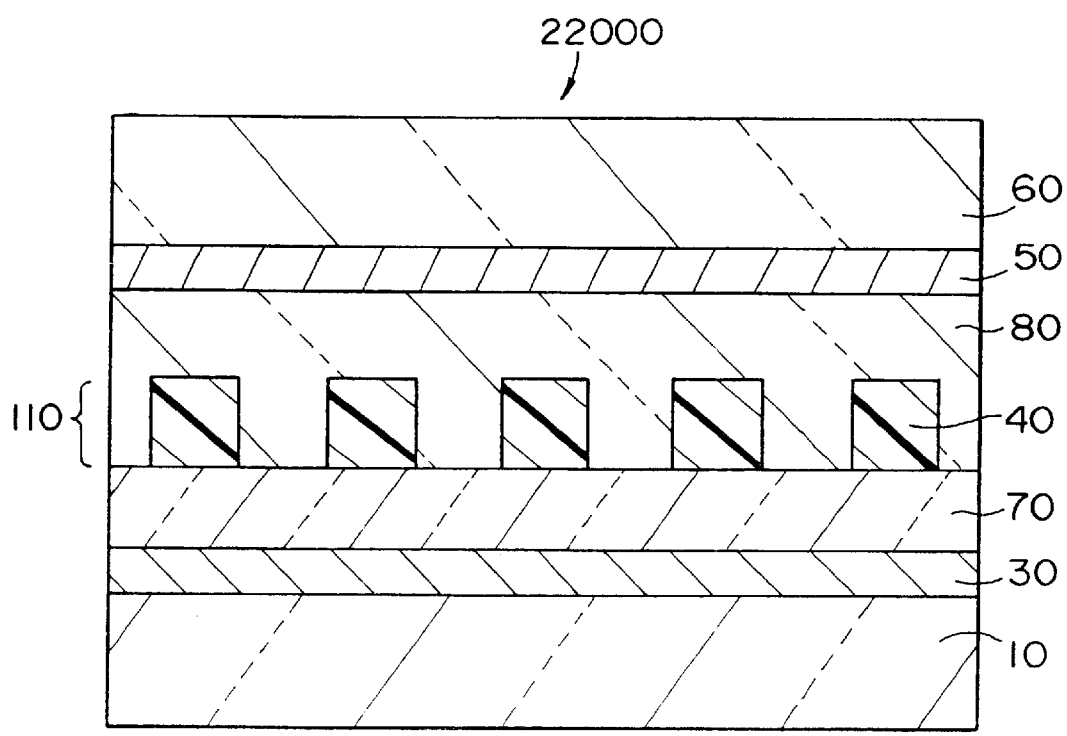
FIG. 9 is a cross-sectional view schematically showing an organic light-emitting device according to a eighth embodiment of the present invention.

FIG. 9 is a cross-sectional view schematically showing an edge-emitting type organic light-emitting device 22000 according to the present embodiment.

In the organic light-emitting device 22000, a first cladding layer 10, anode 30, hole transport layer 70, organic light-emitting layer 40, electron transport layer 80, cathode 50, and second cladding layer 60 are laminated in that order. The refractive indices of the first cladding layer 10 and the second cladding layer 60 in the organic light-emitting device 22000 are designed to be lower than the refractive index of each light transmitting layer existing between the first cladding layer 10 and the second cladding layer 60. The organic light-emitting layer 40 is sandwiched between the hole transport layer 70 and the cathode 50.

In this embodiment, at least the organic light-emitting layer 40 and the electron transport layer 80 also function as a light-transmitting core layer. A grating 110 is formed by the organic light-emitting layer 40 and the electron transport layer 80. Therefore, the refractive indices of the organic light-emitting layer 40 and the electron transport layer 80 are designed to be different. Specifically, the grating 110 is formed by forming the organic light-emitting layers 40 with a prescribed pitch and height on the hole transport layer 70 and filling part of the electron transport layer 80 into the concavities formed between the adjacent organic light-emitting layers 40.

Although not shown in the figure illustrating the organic light-emitting device 22000, it is preferable to form an insulating layer between the hole transport layer 70 and the electron transport layer 80 in the area where the light-emitting layers 40 are not formed. The efficiency of current injection into the light-emitting layer 40 can be improved by forming such an insulating layer.

The action and the effect of the organic light-emitting device 22000 will be described below.

Electrons are injected from the cathode 50 through the electron transport layer 80 and holes are introduced from the anode 30 through the hole transport layer 70 into the organic light-emitting layer 40 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is transmitted inside a core layer toward the edge thereof by distributed feedback type transmission due to the grating 110. The light is emitted from the first coating layer with a low reflectance (not shown).

According to this organic light-emitting device 22000, because the light emitted from the organic light-emitting layer 40 is transmitted inside the organic light-emitting layer 40, efficient light emission is ensured by appropriately selecting the materials for the organic light-emitting layer 40.

(Ninth Embodiment)

Figure 10:
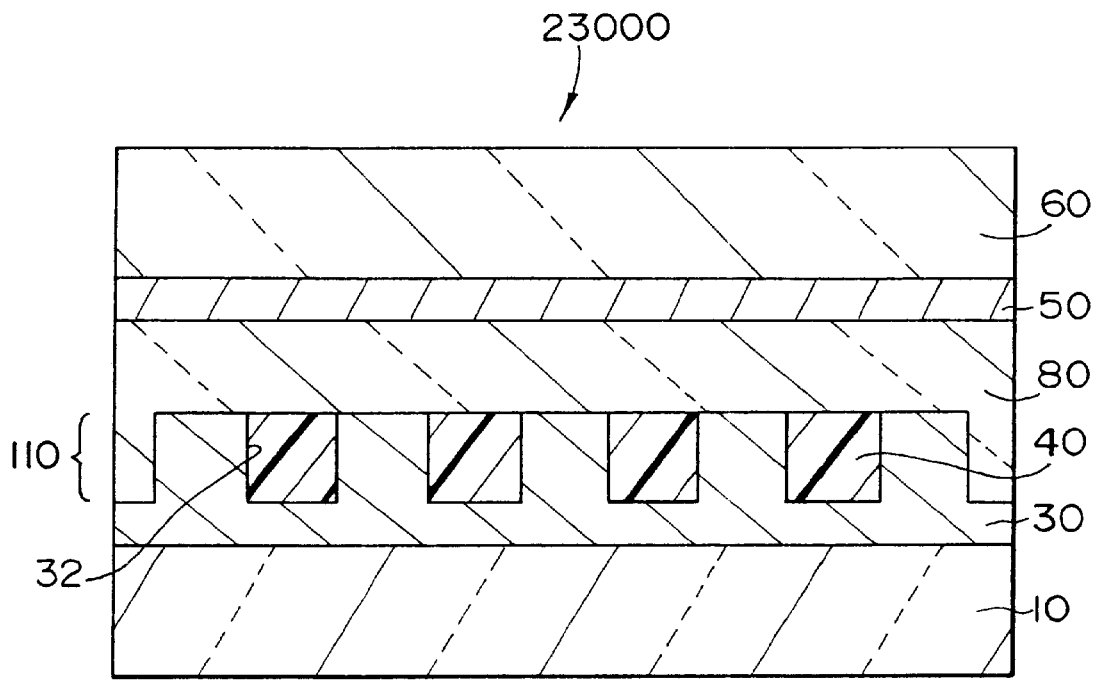
FIG. 10 is a cross-sectional view schematically showing an organic light-emitting device according to a ninth embodiment of the present invention.

FIG. 10 is a cross-sectional view schematically showing an edge-emitting type organic light-emitting device 23000 according to the present embodiment.

In the organic light-emitting device 23000, a first cladding layer 10, anode 30, organic light-emitting layer 40, electron transport layer 80, cathode 50, and second cladding layer 60 are laminated in that order. The refractive indices of the first cladding layer 10 and the second cladding layer 60 in the organic light-emitting device 23000 are designed to be lower than the refractive index of each light transmitting layer existing between the first cladding layer 10 and the second cladding layer 60. The organic light-emitting layer 40 is interposed between the anode 30 and the electron transport layer 80. The organic light-emitting layer 40 constitutes the grating 110.

In this embodiment, at least the anode 30, organic light-emitting layer 40, and electron transport layer 80 also function as a light-transmitting core layer. The grating 110 is formed by the organic light-emitting layer 40 and anode 30. Therefore, the refractive indices of the organic light-emitting layer 40 and the electron transport layer 80 are designed to be different and a transparent conductive layer constitutes the anode 30. Specifically, the grating 110 is formed by forming concavities 32 with a prescribed pitch and depth in the upper portion of the anode 30 and filling the organic light-emitting layer 40 therein. Therefore, the organic light-emitting layers 40 are separate at a prescribed pitch.

The action and the effect of the organic light-emitting device 23000 will be described below.

Electrons are injected from the cathode 50 through the electron transport layer 80 and holes are introduced from the anode 30 into the organic light-emitting layer 40 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is transmitted inside a core layer toward the edge thereof by distributed feedback type transmission due to the grating 110. The light is emitted from the first coating layer with a low reflectance (not shown).

According to this organic light-emitting device 23000, because the light emitted from the organic light-emitting layer 40 is transmitted inside the organic light-emitting layer 40, efficient light emission is ensured by appropriately selecting the materials for the organic light-emitting layer 40.

(Tenth Embodiment)

Figure 11:
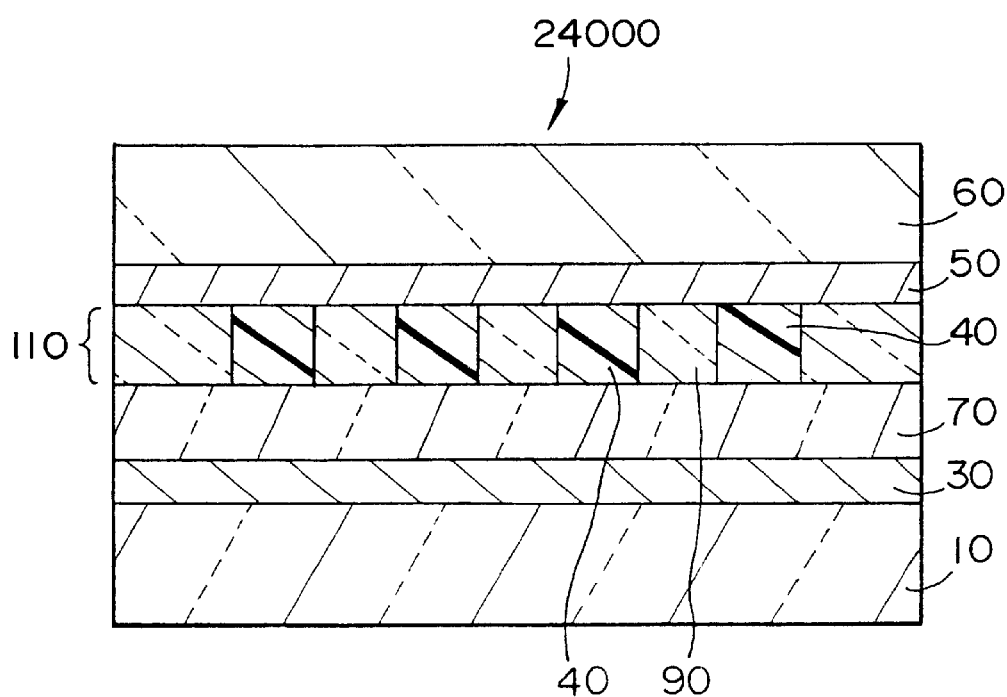
FIG. 11 is a cross-sectional view schematically showing an organic light-emitting device according to a tenth embodiment of the present invention.

FIG. 11 is a cross-sectional view schematically showing an edge-emitting type organic light-emitting device 24000 according to the present embodiment.

In the organic light-emitting device 24000, a first cladding layer 10, anode 30, hole transport layer 70, The grating 110 formed by an organic light-emitting layer 40 and medium layer 90, cathode 50, and second cladding layer 60 are laminated in that order. The refractive indices of the first cladding layer 10 and the second cladding layer 60 in the organic light-emitting device 24000 are designed to be lower than the refractive index of each light transmitting layer existing between the first cladding layer 10 and the second cladding layer 60. The organic light-emitting layer 40 is interposed between the hole transport layer 70 and the cathode 50.

In this embodiment, at least the grating 110 comprising the organic light-emitting layer 40 and the electron transport layer 80 also function as a light-transmitting core layer. A grating 110 is formed by the organic light-emitting layer 40 and the medium layer 90. Therefore, the refractive indices of the organic light-emitting layer 40 and the medium layer 90 are designed to be different. Specifically, the grating 110 is formed by forming the medium layer 90 with a prescribed pitch and height on the hole transport layer 70 and filling the organic light-emitting layers 40 between the medium layers 90. Therefore, the organic light-emitting layers 40 are separated at a prescribed pitch. The organic light-emitting layers 40 may be formed prior to the medium layers 90. The medium layers 90 are preferably formed from organic or inorganic insulation materials. The current injection efficiency into the light-emitting layer 40 can be improved if the medium layers 90 have insulating properties.

The action and the effect of the organic light-emitting device 24000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is transmitted inside a core layer toward the edge thereof by distributed feedback type transmission due to the grating 110. The light is emitted from the first coating layer with a low reflectance (not shown).

According to this organic light-emitting-device 24000, because the light emitted from the organic light-emitting layer 40 is transmitted inside the organic light-emitting layer 40, efficient light emission is ensured by appropriately selecting the materials for the organic light-emitting layer 40.

The above seventh to tenth embodiments illustrate examples using the organic light-emitting layer as a medium for a grating. The present invention is not limited to these embodiments and various embodiments can be employed. For example, a grating may consist of an organic light-emitting layer and other layers and such other layers may be a gaseous layer such as air other than the layers described for the above embodiments. In the case of forming a grating with an air gap structure using such a gaseous layer, the difference in the refractive indices of the two medium layers which constitute the grating can be wider using common materials employed for the light-emitting device, therefore, a good grating which is efficient for a desired light wavelength.

(C) The following eleventh to fourteenth embodiments illustrate examples of an optical fiber integrated light-emitting device comprising an organic light-emitting layer, optical waveguide having a grating, and optical fiber section.

In these embodiments, a section having a light-emitting function equivalent to the light-emitting device described above is referred to as an "EL element section".

(Eleventh Embodiment)

Figure 12:
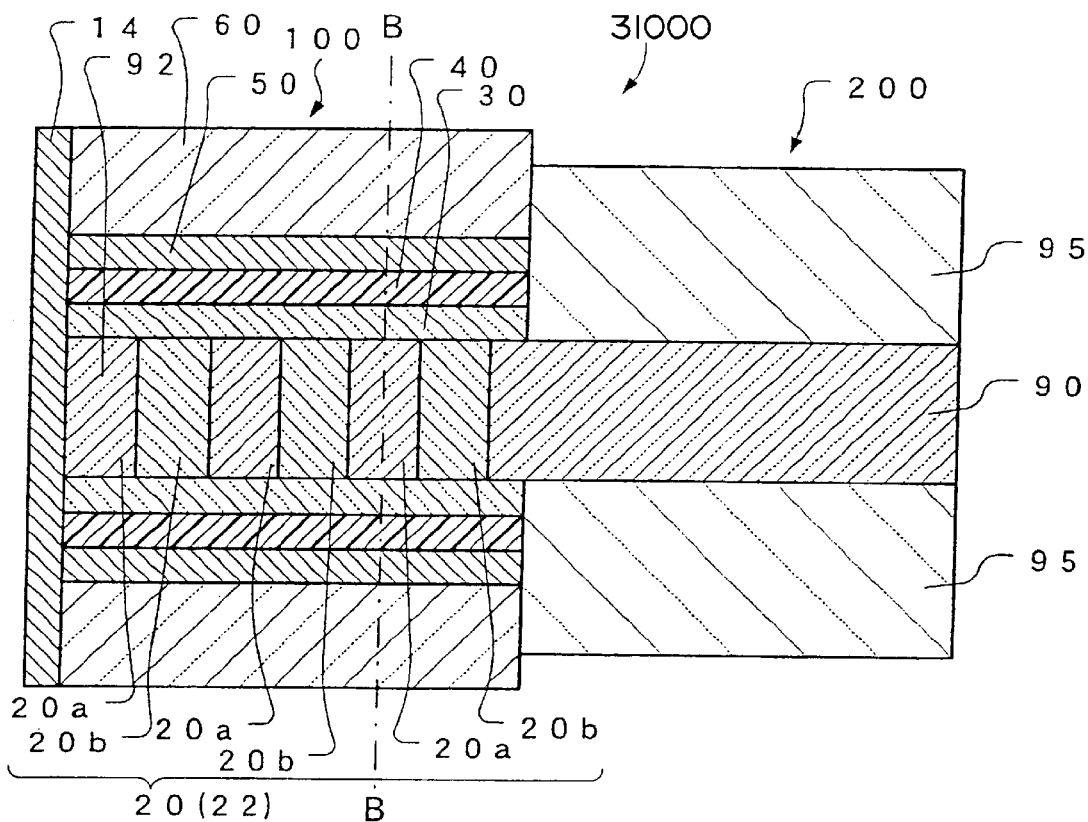
FIG. 12 is a cross-sectional view schematically showing a light-emitting device according to an eleventh embodiment of the present invention.
Figure 13:
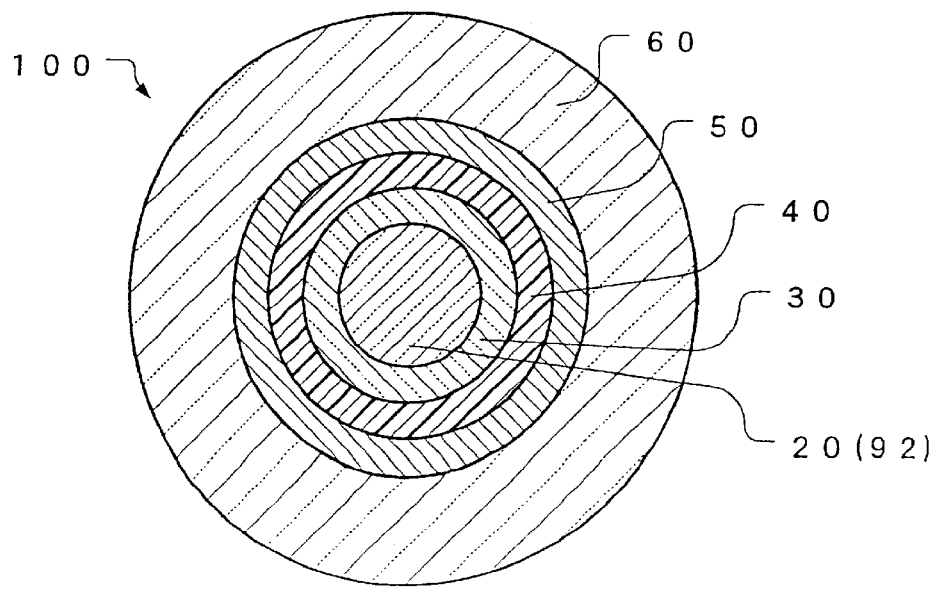
FIG. 13 is a schematic cross-section viewed along the line B—B in FIG. 12.

FIG. 12 is a schematic vertical section of an organic light-emitting device 31000 according to the present embodiment. FIG. 13 is a schematic cross-section viewed along the line B—B in FIG. 12.

The light-emitting device 31000 comprises an optical fiber section 200 and an EL element section 100 formed at the end of the optical fiber section 200.

The optical fiber section 200 comprises a core layer 90 and a cladding layer 95 surrounding the core layer 90.

Each layer in the EL element section 100 is formed in almost concentric circles as shown in cross-section in FIG. 13. An EL core layer 20, anode 30, organic light-emitting layer 40, cathode 50, and EL cladding layer 60 are laminated in that order from the center. The refractive index of the EL cladding layer 60 in the light-emitting device 31000 is designed to be lower than the refractive index of each light transmitting layer encircled by the EL cladding layer 60.

The light-transmitting EL core layer 20 formed along the inside of the anode 30 is a core-layer-continuing portion 92 which continues from the core layer 90 of the optical fiber section 200. In the EL core layer 20, a first layer 20a and a second layer 20b each of which has a different refractive index continue alternately in the direction of the length to form a grating 22. The light-emitting device 31000 comprises the EL core layer 20 which comprises the core-layer-continuing portion 92 which continues from the core layer 90 of the optical fiber section 200, whereby the light output from the EL core layer 20 is transmitted to the optical fiber with high efficiency. Moreover, this highly efficient combination is obtained without performing a delicate optical adjustment.

The anode 30 is formed from conductive materials which transmit light so that the light emitted from the organic light-emitting layer 40 is introduced into the EL core layer 20. The materials mentioned above can be used as materials for this transparent electrode. It is preferable to design the anode 30 and the EL core layer 20 so that the refractive indices differ from the refractive index of the organic light-emitting layer 40, whereby the light emitted from the organic light-emitting layer 40 is efficiently introduced into the EL core layer 20. In particular, the refractive index of the EL core layer 20 is preferably designed to be higher than the refractive index of the organic light-emitting layer 40.

The grating 22 is preferably a distributed feedback type grating. Such a distributed feedback type grating causes light to resonate, thereby making it possible to obtain excellent light exhibiting wavelength selectivity and directivity with a narrow emission spectrum width. It is preferable that the grating 22 have a $\lambda/4$ phase shifted structure or a gain-coupled structure (not shown). Such a $\lambda/4$ phase shifted structure or a gain-coupled structure ensures that the light is emitted with a single mode.

It is also preferable to form a distributed feedback type grating as in the following twelfth to fourteenth embodiments. Therefore, this will not be further mentioned in the description of these embodiments.

In the light-emitting device 31000, a coating layer 14 with a high reflectance is formed at one end. As the coating layer 14, for example, dielectric multi-layered mirrors commonly used in semiconductor DFB lasers can be used.

It is also preferable to provide such a dielectric multi-layered mirror as in the following twelfth to fourteenth embodiments. Therefore, this will not be further mentioned in the description of these embodiments.

The action and the effect of the light-emitting device 31000 will be described below.

Electrons and holes are introduced into the organic light-emitting layer 40 respectively from the cathode 50 and the anode 30 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated.

The light emitted from the organic light-emitting layer 40 is partially reflected by the cathode 50 or the EL cladding layer 60. Part of the light is directly introduced into the EL core layer 20 through the anode 30 made of a transparent conductive layer. The light introduced into the EL core layer 20 is transmitted inside the EL core layer 20 by distributed feedback type transmission due to the grating 22 and is emitted to the core layer 90 of the optical fiber section 200. The light is emitted through distributed feedback in the EL core layer 20 by the grating 22. Because of this, the emitted light has wavelength selectivity, a narrower emission spectrum width, and excellent directivity.

Furthermore, light with a single mode can be obtained more easily by the grating 22 having a $\lambda/4$ phase shifted structure or a gain-coupled structure. "$\lambda$" used herein indicates the wavelength of the light inside the optical waveguide. This also applies to the following twelfth to fourteenth embodiments and will not be further mentioned in the description of these embodiments.

Because the EL core layer 20 comprises the core-layer-continuing portion 92 which continues from the core layer 90 of the optical fiber section 200, the light output from the EL core layer 20 is introduced into the optical fiber section 200 with high efficiency. Moreover, there is no need to perform a delicate optical adjustment.

The EL cladding layer 60 is formed outside the cathode 50 in the example shown in the figure. In the case where the cathode 50 can fully reflect the light emitted from the organic light-emitting layer 40, the EL cladding layer 60 may be omitted. This also applies to the following twelfth to fourteenth embodiments.

The anode 30 is formed so as to be in contact with the EL core layer 20 in the example shown in the figure. The cathode 50 may be formed so as to be in contact with the EL core layer and the anode 30 may be formed outside the organic light-emitting layer 40. For example, in the case where the cathode 50 is thin, light emitted from the light-emitting layer 40 can penetrate the cathode 50. In this case, light with excellent wavelength selectivity and directivity can be emitted to the core layer 90 of the optical fiber section 200 in the same manner as in the above cases by forming the EL core layer 20 having the grating 22 inside the cathode 50. This modification also applies to the following twelfth to fourteenth embodiments.

Instead of forming the anode 30 and cathode 50 to be in contact with the organic light-emitting layer 40, a hole transport layer may be formed between the anode 30 and the organic light-emitting layer 40 or an electron transport layer may be formed between the cathode 50 and the organic light-emitting layer 40.

In order to obtain a good external connection, it is preferable to expose the peripheries, that is, the curved surfaces of the anode 30 and the cathode 50 to secure an electrical connection in the wide area.

As a method of manufacturing a grating 22 or organic light-emitting layer 40 of the light-emitting device 31000 and materials constituting each layer, the methods and materials described above can be appropriately used. For example, in the formation of the grating 22 in the EL core layer 20, a method of forming a refractive index distribution by irradiation and the like can be preferably used. These methods and materials also apply to the following twelfth to fourteenth embodiments.

(Twelfth Embodiment)

Figure 14:
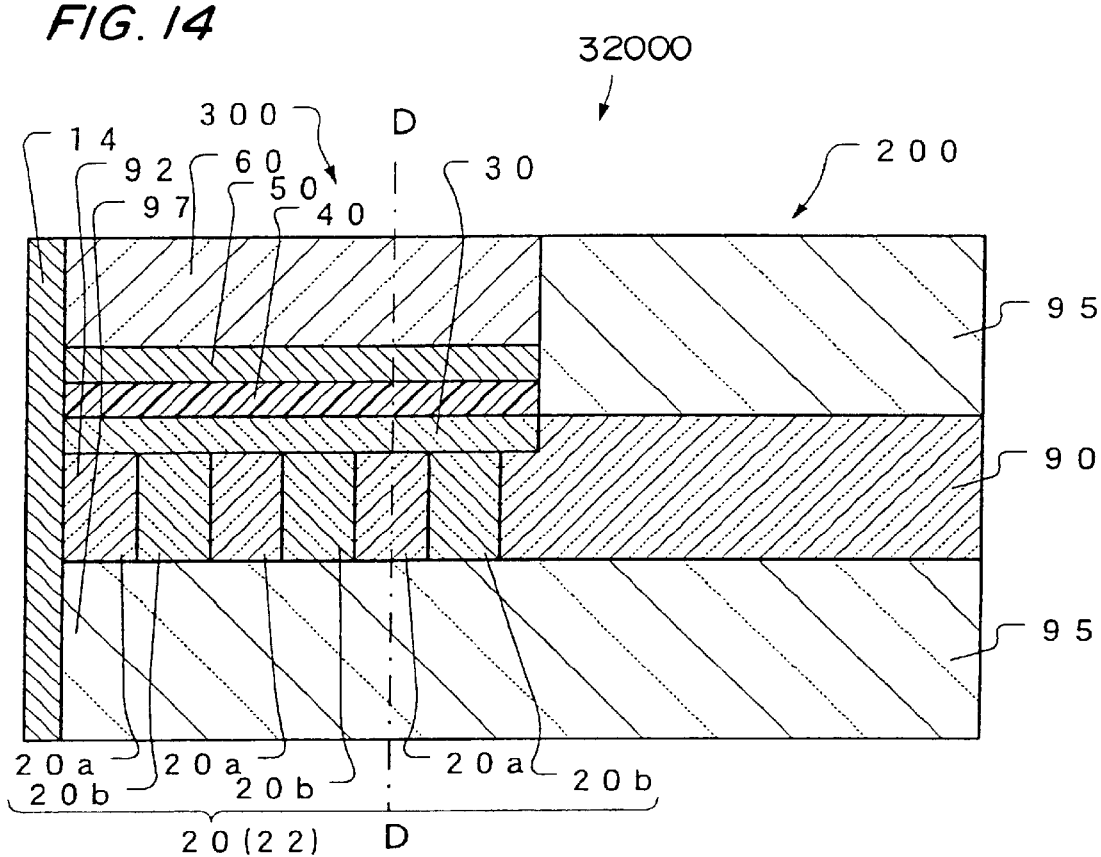
FIG. 14 is a schematic vertical section of a light-emitting device according to an twelfth embodiment of the present invention.
Figure 15:
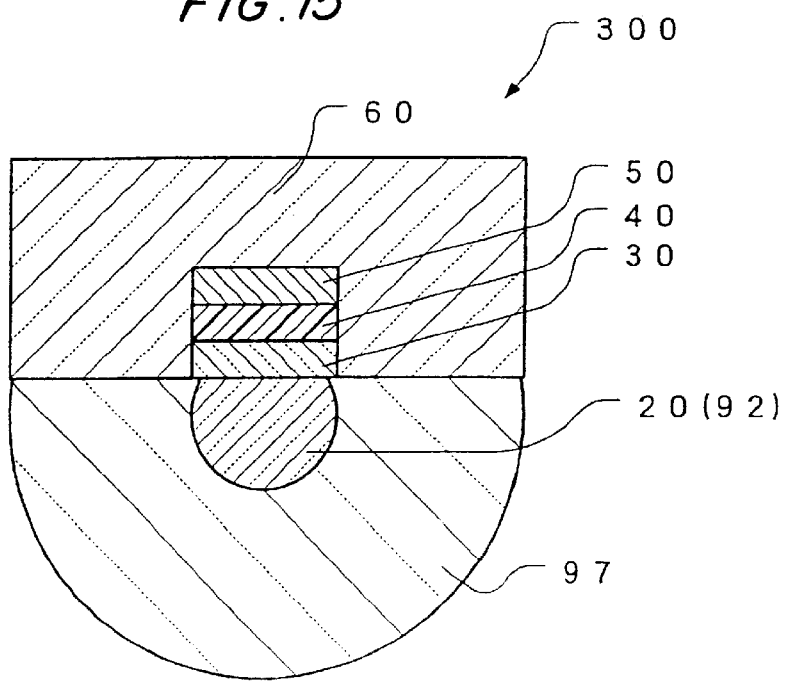
FIG. 15 is a schematic cross-section viewed along the line D—D in FIG. 14.

FIG. 14 is a schematic vertical section of a light-emitting device 32000 according to the present embodiment. FIG. 15 is a schematic cross-section viewed along the line D—D in FIG. 14.

In the light-emitting device 32000, the EL element section is not formed in concentric circles like the eleventh embodiment as shown in these figures. The feature of the light-emitting device 32000 is as follows. In the light-emitting device 32000 according to this embodiment, almost half of a core-layer-continuing portion 92 and a cladding-layer-continuing portion 97 which continue respectively from a core layer 90 and a cladding layer 95 of an optical fiber section 200 is removed horizontally. An anode 30, organic light-emitting layer 40, cathode 50, and EL cladding layer 60 are laminated almost flat on the section. Other features are as same as in the eleventh embodiment and description thereof is omitted. Corresponding sections in each figure are indicated by the same symbols as in the eleventh embodiment.

As shown in cross-sectional FIG. 15, almost half of the core-layer-continuing portion 92 and the cladding-layer-continuing portion 97 which continue respectively from the core layer 90 and the cladding layer 95 of the optical fiber section 200 is removed horizontally in the EL element section 300. The anode 30, organic light-emitting layer 40, cathode 50, and EL cladding layer 60 are laminated almost flat on the section. The anode 30 is formed flat to be continuously in contact with the core-layer-continuing portion 92. The organic light-emitting layer 40 is formed flat to be in contact with the other side of the anode 30. The cathode 50 is formed flat to be in contact with the organic light-emitting layer 40. The EL cladding layer 60 is formed to enclose the anode 30, organic light-emitting layer 40, and cathode 50 in the directions of the lengths. The EL cladding layer 60 is joined with the cladding-layer-continuing portion 97. The refractive index of the EL cladding layer 60 in the light-emitting device 32000 is designed to be lower than the refractive index of each light transmitting layer enclosed by the EL cladding layer 60.

The EL core layer 20 is formed along the bottom of the anode 30 and comprises the core-layer-continuing portion 92 which continues from the core layer 90 of the optical fiber section 200. In the EL core layer 20, a first layer 20*a* and a second layer 20*b*, each of which has a different refractive index, continue alternately in the direction of the length to form a grating 22. The light-emitting device 32000 comprises the EL core layer 20 which comprises the core-layer-continuing portion 92 which continues from the core layer 90 of the optical fiber section 200, whereby the light output from the EL core layer 20 is transmitted to the optical fiber with high efficiency. Moreover, this highly efficient combination is obtained without performing a delicate optical adjustment.

Either the first layer 20*a* or second layer 20*b* which constitutes the EL core layer 20 may be a gaseous layer such as air. In the case of forming the grating 22 by such a gaseous layer, the grating 22 having a large difference in the refractive index between the layers 20*a* and 20*b* can be easily formed.

In the EL element section 300 according to this embodiment, the anode 30, organic light-emitting layer 40, and cathode 50 are formed corresponding to the width of the EL core layer 20 as shown in FIG. 15. For example, the anode 30, organic light-emitting layer 40, and cathode 50 may all be formed over the EL core layer 20 and the cladding-layer-continuing portion 97 on the section shown in FIG. 15.

(Thirteenth Embodiment)

Figure 16:
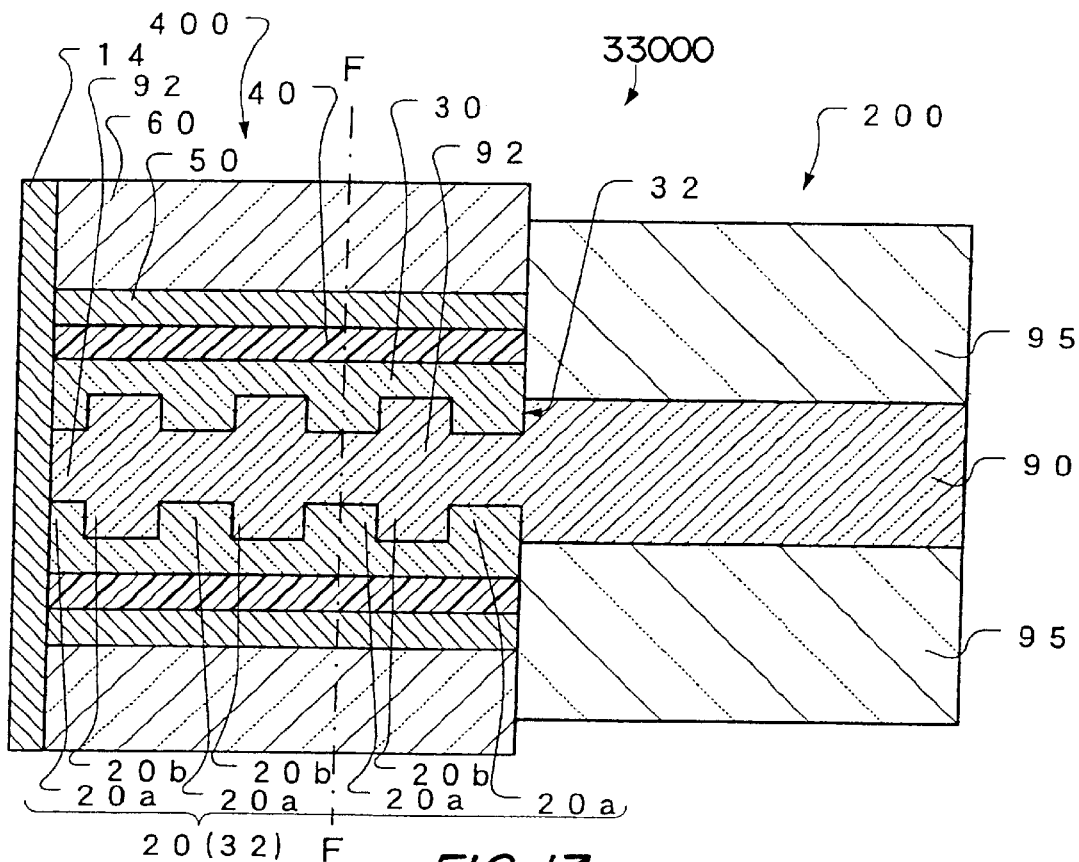
FIG. 16 is a schematic vertical section of a light-emitting device according to an thirteenth embodiment of the present invention.
Figure 17:
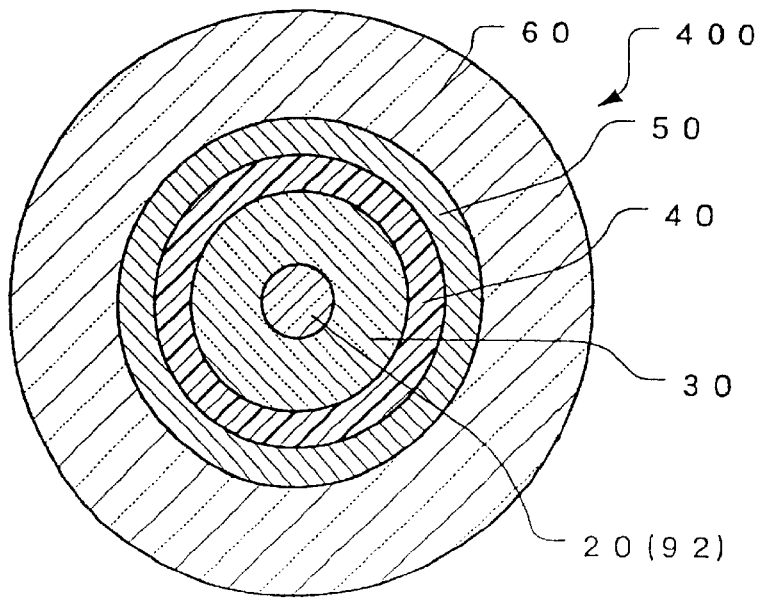
FIG. 17 is a schematic cross-section viewed along the line F—F in FIG. 16.

FIG. 16 is a schematic vertical section of a light-emitting device 33000 according to the present embodiment. FIG. 17 is a schematic cross-section viewed along the line F—F in FIG. 16.

This light-emitting device 33000 differs from the light-emitting device 31000 according to the eleventh embodiment in that the EL core layer 20 comprises the core-layer-continuing portion 92 and the anode 30. Other features are as same as in the eleventh embodiment and description thereof is omitted. Corresponding sections in each figure are indicated by the same symbols as in the eleventh embodiment.

The light-transmitting EL core layer 20 is formed by the anode 30 and the core-layer-continuing portion 92. In the EL core layer 20, a grating 32 is formed in the boundary area between the anode 30 and the core-layer-continuing portion 92 where the first layer 20a (anode 30) and the second layer 20b (core-layer-continuing portion 92) continue alternately in the direction of the length. The light-emitting device 33000 comprises the EL core layer 20 which comprises the core-layer-continuing portion 92 which continues from the core layer 90 of the optical fiber section 200, whereby the light output from the EL core layer 20 is transmitted to the optical fiber with high efficiency. Moreover, this highly efficient combination is obtained without performing a delicate optical adjustment.

It is preferable to design the anode 30 and the core-layer-continuing portion 92 so that the refractive indices differ from the refractive index of the organic light-emitting layer 40, whereby the light emitted from the organic light-emitting layer 40 is efficiently introduced into the anode 30 and the core-layer-continuing portion 92.

The action and the effect of the light-emitting device 33000 will be described below.

Electrons are introduced from the cathode 50 and holes are injected from the anode 30 into the organic light-emitting layer 40 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is partially reflected by the cathode 50 or the EL cladding layer 60. Part of the light is directly introduced into the anode 30 and the core-layer-continuing portion 92. The light introduced into the anode 30 and the core-layer-continuing portion 92 is transmitted inside the EL core layer 20 toward the edge thereof by distributed feedback type transmission due to the grating 32 and is emitted to the core layer 90 of the optical fiber section 200.

The embodiment illustrates the case of forming the grating 32 by the anode 30 and the core-layer-continuing portion 92. The grating 32 may be formed by the cathode 50 and the core-layer-continuing portion 92 instead of the anode 30 and the core-layer-continuing portion 92 by exchanging the positions of the anode 30 and the cathode 50.

In the same manner as in the differences between the eleventh embodiment and the twelfth embodiment, almost half of the core-layer-continuing portion 92 and the cladding-layer-continuing portion 97 which continue respectively from a core layer 90 and a cladding layer 95 of an optical fiber section 200 may be removed horizontally, instead of forming the EL element section 400 in concentric circles. The anode 30, organic light-emitting layer 40, cathode 50, and EL cladding layer 60 may be laminated almost flat on the section.

(Fourteenth Embodiment)

Figure 18:
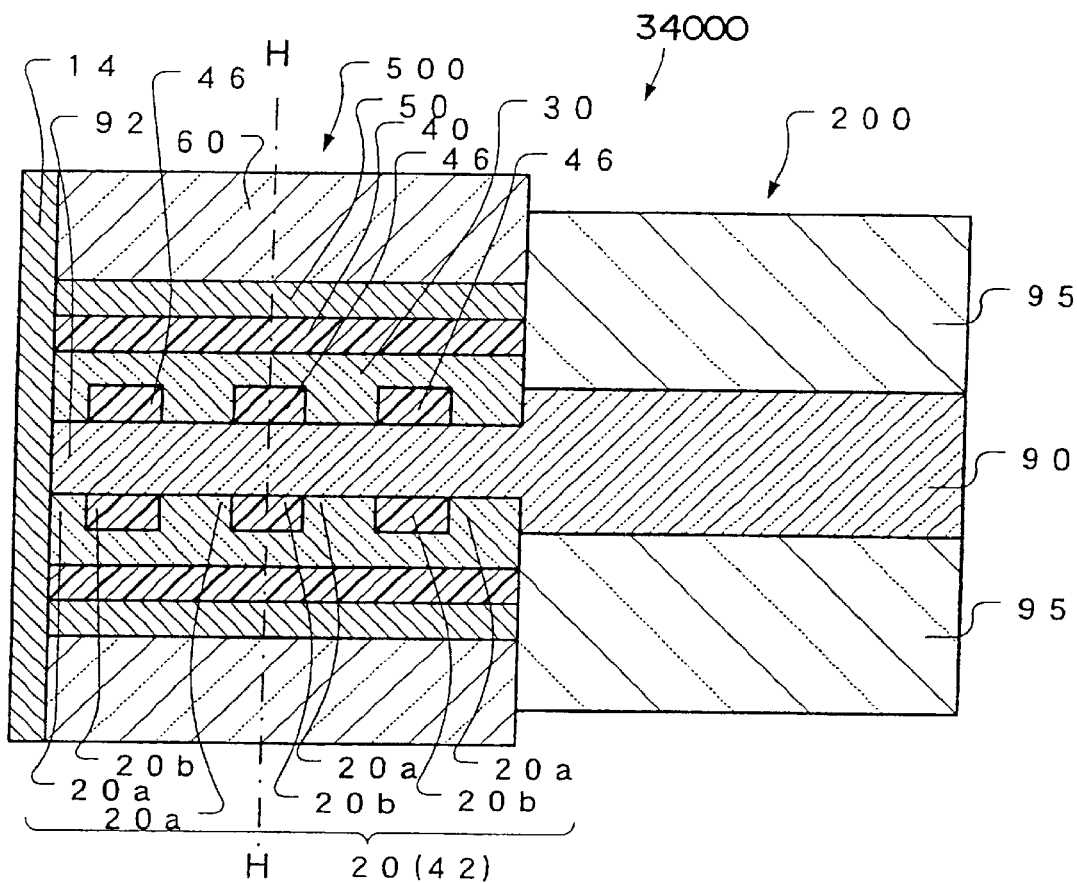
FIG. 18 is a cross-sectional view schematically showing a light-emitting device according to a fourteenth embodiment of the present invention.
Figure 19:
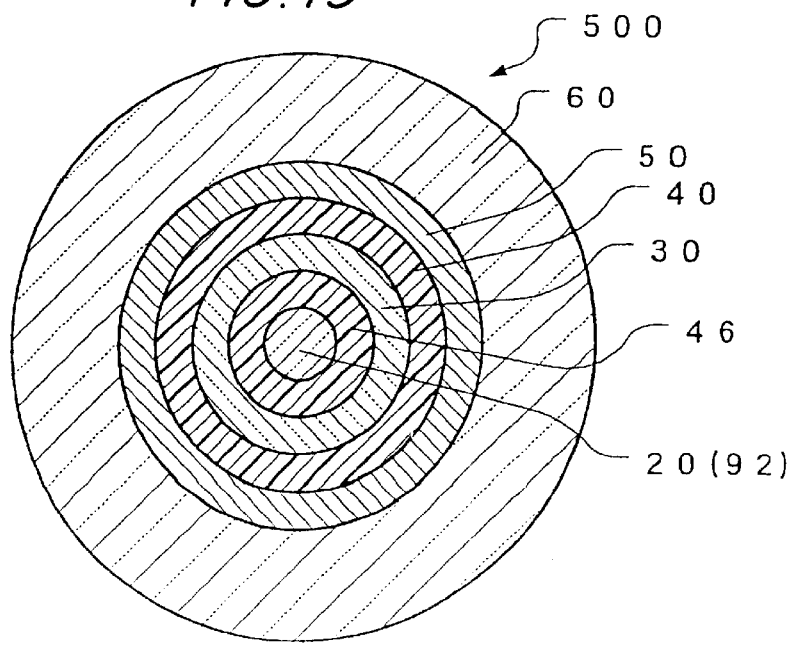
FIG. 19 is a schematic cross-section viewed along the line H—H in FIG. 18.

FIG. 18 is a schematic vertical section of a light-emitting device 34000 according to the present embodiment. FIG. 19 is a schematic cross-section viewed along the line H—H in FIG. 18.

This light-emitting device 34000 differs from the light-emitting device 31000 according to the eleventh embodiment in that the EL core layer 20 comprises the anode 30 and medium layers 46 formed in the anode 30 at intervals in the direction of the length. Other features are the same as in the eleventh embodiment and further description thereof is omitted. Corresponding sections in each figure are indicated by the same symbols as in the eleventh embodiment.

In the light-emitting device 34000, the light-transmitting EL core layer 20 comprises the anode 30 and the medium layers 46 formed in the anode 30. In the EL core layer 20, the first layer 20a (part of the anode 30) and the second layer 20b (medium layers 46) having different refractive indices continue alternately to form a grating 42.

The above-mentioned materials for the optical waveguide can be used as the material for the medium layers 46.

As shown in FIGS. 18 and 19, the light-emitting device 34000 comprises the EL core layer 20 which is formed so as to encircle the core-layer-continuing portion 92 which continues from the core layer 90 of the optical fiber section 200, whereby the light output from the EL core layer 20 is transmitted to the optical fiber with high efficiency. Moreover, this highly efficient combination is obtained without performing a delicate optical adjustment.

It is preferable to design the refractive indices of anode 30, medium layers 46, and the core-layer-continuing portion 92 to be different from the refractive index of the organic light-emitting layer 40 so that the light emitted from the organic light-emitting layer 40 is efficiently introduced into the anode 30, medium layers 46, and core-layer-continuing portion 92.

The action and the effect of the light-emitting device 34000 will be described below.

Electrons are introduced from the cathode 50 and holes are injected from the anode 30 into the organic light-emitting layer 40 by applying a prescribed voltage to the anode 30 and the cathode 50. Excitons are formed in the organic light-emitting layer 40 by recombination of the electrons and holes. Light such as fluorescent light and phosphorescent light is emitted when these excitons are deactivated. The light emitted from the organic light-emitting layer 40 is partially reflected by the cathode 50 or the EL cladding layer 60. Part of the light is directly introduced into the anode 30 and the medium layers 46. The light introduced into the anode 30 and the medium layers 46 is transmitted inside the EL core layer 20 toward the edge thereof by the distributed feedback type transmission due to the grating 42 and is emitted to the core layer 90 of the optical fiber section 200.

This embodiment illustrates the case of forming the grating 42 by the anode 30 and the medium layers 46 formed at intervals. The grating 42 may be formed by the cathode 50 and the medium layers 46 by exchanging the positions of the anode 30 and the cathode 50.

In the same manner as in the difference between the eleventh embodiment and the twelfth embodiment, almost half of the core-layer-continuing portion 92 and the cladding-layer-continuing portion 97 which continue respectively from a core layer 90 and a cladding layer 95 of an optical fiber section 200 may be removed horizontally, instead of forming the EL element section 500 in concentric circles. The anode 30, medium layers 46, organic light-emitting layer 40, cathode 50, and EL cladding layer 60 may be laminated almost flat on the section.

According to the above eleventh to fourteenth embodiments, a light-emitting device with a narrow wavelength spectral width, excellent directivity, and superior positioning precision between the light-emission part and transmission part is provided.

(D) The following fifteenth to twenty-fifth embodiments illustrate a light-emitting device comprising an organic light-emitting layer and an optical waveguide having a grating which constitutes a photonic band gap.

Among the embodiments described below, the fifteenth to seventeenth embodiments illustrate the case where an organic light-emitting layer is formed in a defect of a grating.

(Fifteenth Embodiment)

Figure 20:
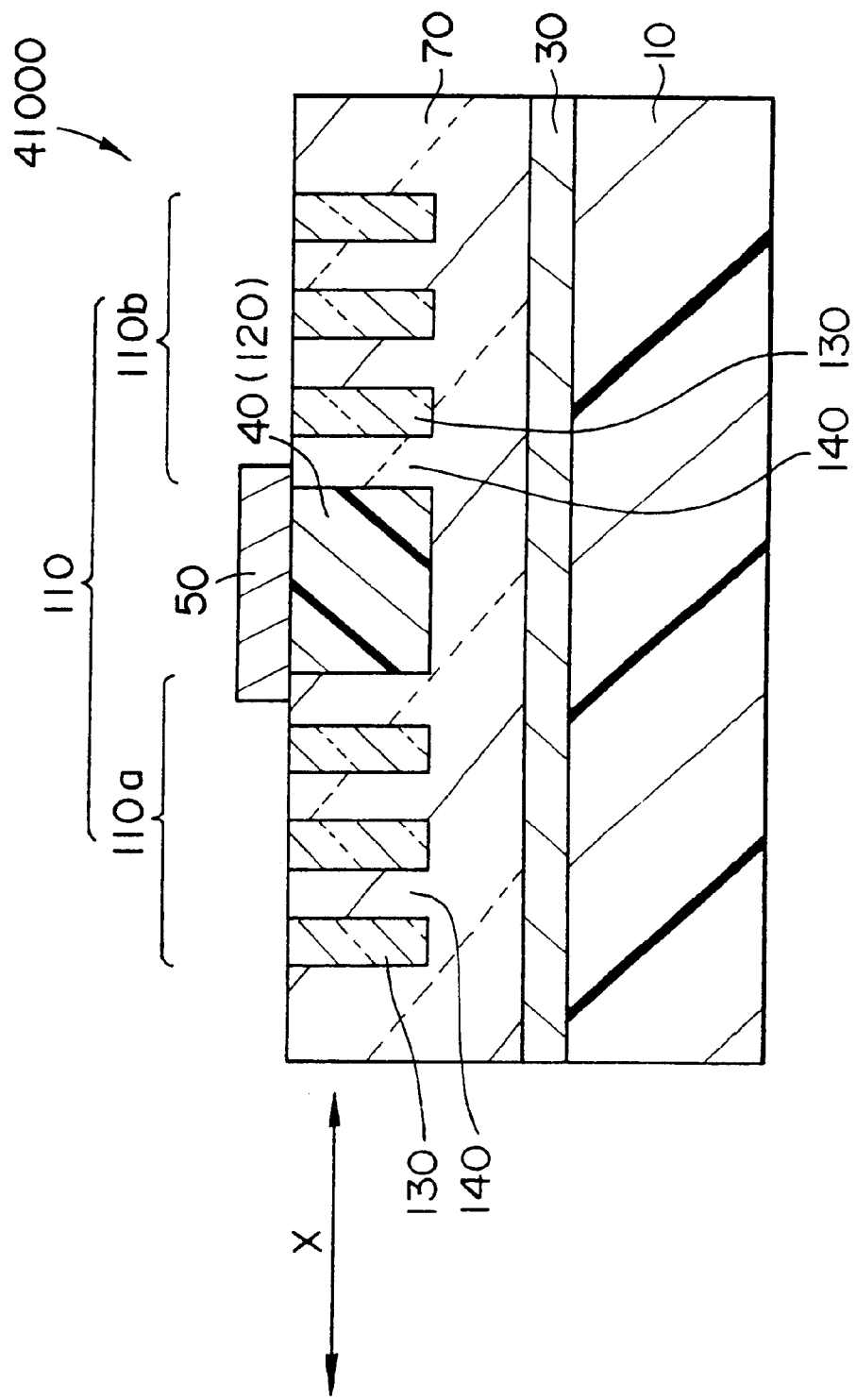
FIG. 20 is a cross-sectional view schematically showing a light-emitting device according to a fifteenth embodiment of the present invention.

FIG. 20 is a cross-sectional view schematically showing a light-emitting device 41000 according to the present embodiment. The light-emitting device 41000 comprises a substrate 10, anode 30, hole transport layer 70, organic light-emitting layer 40, cathode 50, and grating 110.

The grating 110 comprises a defect 120 and first and second gratings 110$a$ and 110$b$ at each side of the defect 120. These gratings 110$a$ and 110$b$ can form a photonic band gap to a prescribed wavelength range on the basis of the shape (dimensions) and combinations of the media. First medium layers 130 and second medium layers 140 having different refractive indices are arranged alternately in the gratings 110$a$ and 110$b$. The second medium layer 140 is formed of a hole transport layer 70. The materials for the first medium layers 130 are not limited insofar as the first medium layers 130 can form a photonic band gap by periodic distribution with the second medium layers 140. For example, the second medium layer may be a gaseous body such as air. In the case of forming a grating with a so-called air-gap structure by such a gaseous layer, the difference in the refractive indices of the two medium layers which constitute a grating can be increased while using materials commonly used for light-emitting devices.

The organic light-emitting layer 40 is embedded into the defect 120. In the present embodiment, the defect 120 of the grating 110 also functions as the light-emitting layer 40. The defect 120 is formed so that the energy level caused by the vacancy exists inside the emission spectrum of the organic light-emitting layer 40 by the electrically pumping.

The cathode 50 is formed locally to cover the surface of the organic light-emitting layer 40. An electric current is intensively supplied to the organic light-emitting layer 40 by forming the cathode 50 on only the organic light-emitting layer 40, whereby the electric current loss can be reduced.

Because the light is confined by the grating 110 having a one-dimensional photonic band gap in the light-emitting device 41000 according to this embodiment, optical transmission is controlled only in the direction in which the grating 110 extends (direction X in FIG. 1). Therefore, light with a leakage mode is transmitted in other directions. In order to control the transmission of the light with such a leakage mode, a cladding layer or a dielectric multiple-layered mirror may be optionally formed to confine the light. This also applies to the following sixteenth to twenty-fifth embodiments and will not be further mentioned in the description of these embodiments.

The action and the effect of the light-emitting device 41000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of these electrons and holes. Light with a wavelength range equivalent to the photonic band gap of the grating 110 cannot be transmitted inside the grating 110. The excitons are returned to the ground state at an energy level caused by the vacancy and only the light with a wavelength range equivalent to this energy level is emitted. Therefore, light with a remarkably narrow emission spectrum width prescribed by the width of the energy level caused by the vacancy can be obtained with high efficiency.

The function of the photonic band gap also applies to the following sixteenth to twenty-fifth embodiments. Therefore, this will not be further mentioned in the description of these embodiments.

As a method of manufacturing the grating 110 of the light-emitting device 41000 and materials constituting each layer, the methods and materials described above can be appropriately used. These methods and materials also apply to the following other embodiments.

(Sixteenth Embodiment)

Figure 21:
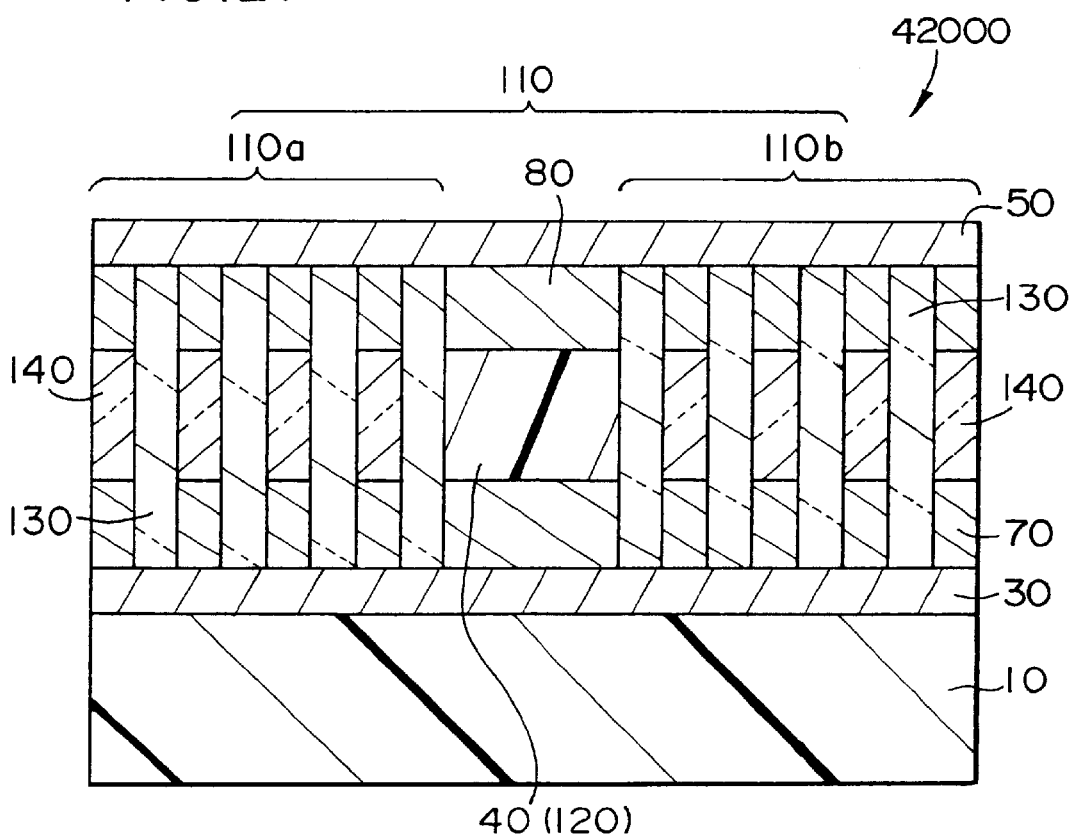
FIG. 21 is a cross-sectional view schematically showing a light-emitting device according to a sixteenth embodiment of the present invention.

FIG. 21 is a cross-sectional view schematically showing a light-emitting device 42000 according to the present embodiment. The light-emitting device 42000 comprises a substrate 10, anode 30, hole transport layer 70, organic light-emitting layer 40, electron transport layer 80, cathode 50, and grating 110. The anode 30 and the cathode 50 are formed continuously. The hole transport layer 70 and the electron transport layer 80 are formed discontinuously.

The grating 110 comprises a defect 120, and the organic light-emitting layer 40 is formed in this defect 120. First and second gratings 110$a$ and 110$b$ are formed at both sides of the defect 120. These gratings 110$a$ and 110$b$ can form a photonic band gap to a prescribed wavelength range. The first medium layers 130 and the second medium layer 140 having different refractive indices are arranged alternately in the gratings 110$a$ and 110$b$. The first medium layers 130 are formed from the anode 30 to the cathode 50. The second medium layers 140 stand between the hole transport layer 70 and the electron transport layer 80. Both the first and second medium layers 130 and 140 have insulating properties. Because the first and second medium layers 130 and 140 have insulating properties, an electric current passes only through the organic light-emitting layer 40 formed in the defect 120 through the hole transport layer 40 and the electron transport layer 80 when a voltage is applied to the anode 30 and the cathode 50. The materials for the first medium layer 130 and the second medium layer 140 are limited insofar as these two layers can form a photonic band gap by periodic distribution.

The organic light-emitting layer 40 is embedded into the defect 120. In the present embodiment, the defect 120 of the grating 110 also functions as the light-emitting layer 40. The defect 120 is formed so that the energy level caused by the vacancy exists inside the emission spectrum of the organic light-emitting layer 40 by the electrically pumping.

The action and the effect of the light-emitting device 42000 will be described below.

Electrons are introduced from the cathode 50 through the electron transport layer 80 and holes are introduced from the anode 30 through the hole transport layer 70 into the organic light-emitting layer 40 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

(Seventeenth Embodiment)

Figure 22:
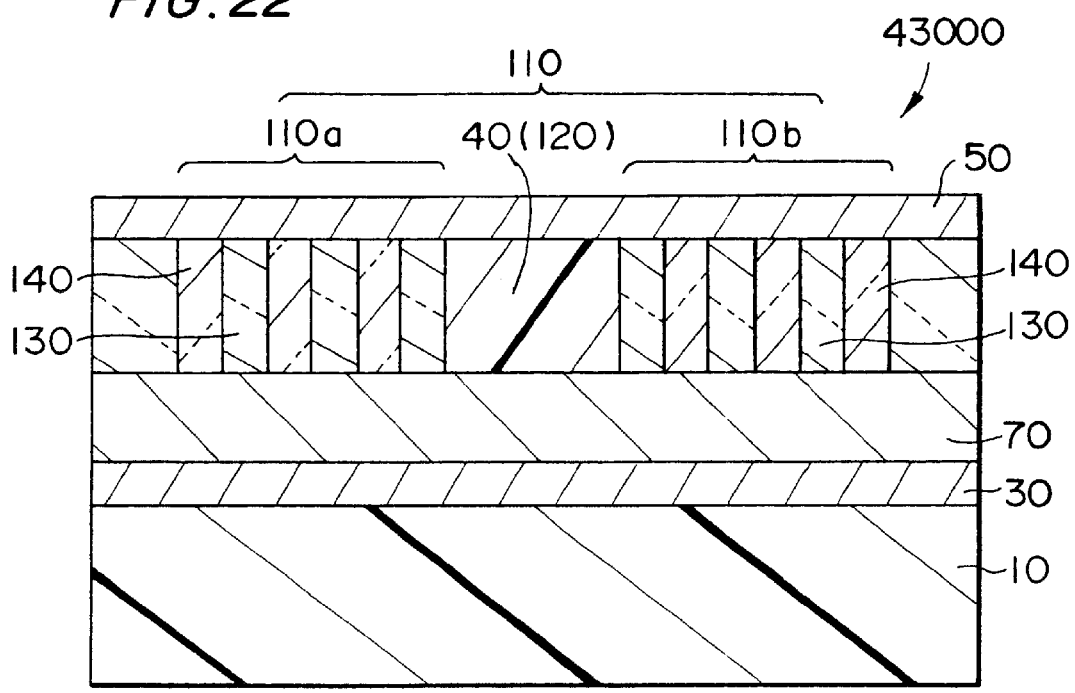
FIG. 22 is a cross-sectional view schematically showing a light-emitting device according to a seventeenth embodiment of the present invention.

FIG. 22 is a cross-sectional view schematically showing a light-emitting device 43000 according to the present embodiment. The light-emitting device 43000 resembles the above-described light-emitting device 42000 but differs inasmuch as the hole transport layer is continuously formed without forming an insulating layer. The light-emitting device 43000 comprises a substrate 10, anode 30, hole transport layer 70, organic light-emitting layer 40, cathode 50, and grating 110. The anode 30, hole transport layer 70, and cathode 50 are continuously formed.

The grating 110 comprises a defect 120, and the organic light-emitting layer 40 is formed in this defect 120. A first and second gratings 110a and 110b are formed at both sides of the defect 120. These gratings 110a and 110b can form a photonic band gap to a prescribed wavelength range. First medium layers 130 and second medium layers 140 having different refractive indices are arranged alternately in the gratings 110a and 110b. The first and second medium layers 130 and 140 stand between the hole transport layer 70 and the cathode 50. Both the first and second medium layers 130 and 140 have insulating properties. Because the first and second medium layers 130 and 140 have insulating properties, an electric current from the cathode 50 passes through the organic light-emitting layer 40 formed in the defect 120 when a voltage is applied to the anode 30 and the cathode 50. The materials for the first medium layer 130 and the second medium layer 140 are limited insofar as these two layers can form a photonic band gap by the periodic distribution.

The organic light-emitting layer 40 is embedded into the defect 120. In the present embodiment, the defect 120 of the grating 110 also functions as the light-emitting layer 40. The defect 120 is formed so that the energy level caused by the vacancy exists inside the emission spectrum of the organic light-emitting layer 40 by the electrically pumping.

The action and the effect of the light-emitting device 43000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

Although an electron transport layer is not formed in this embodiment, an electron transport layer may be formed between the organic light-emitting layer 40 and the cathode 50. It is unnecessary to form both the hole transport layer and the electron transport layer. Either of these transport layers may be sufficient. This also applies to other embodiments having a grating constituting a photonic band gap.

(Eighteenth Embodiment)

Figure 23:
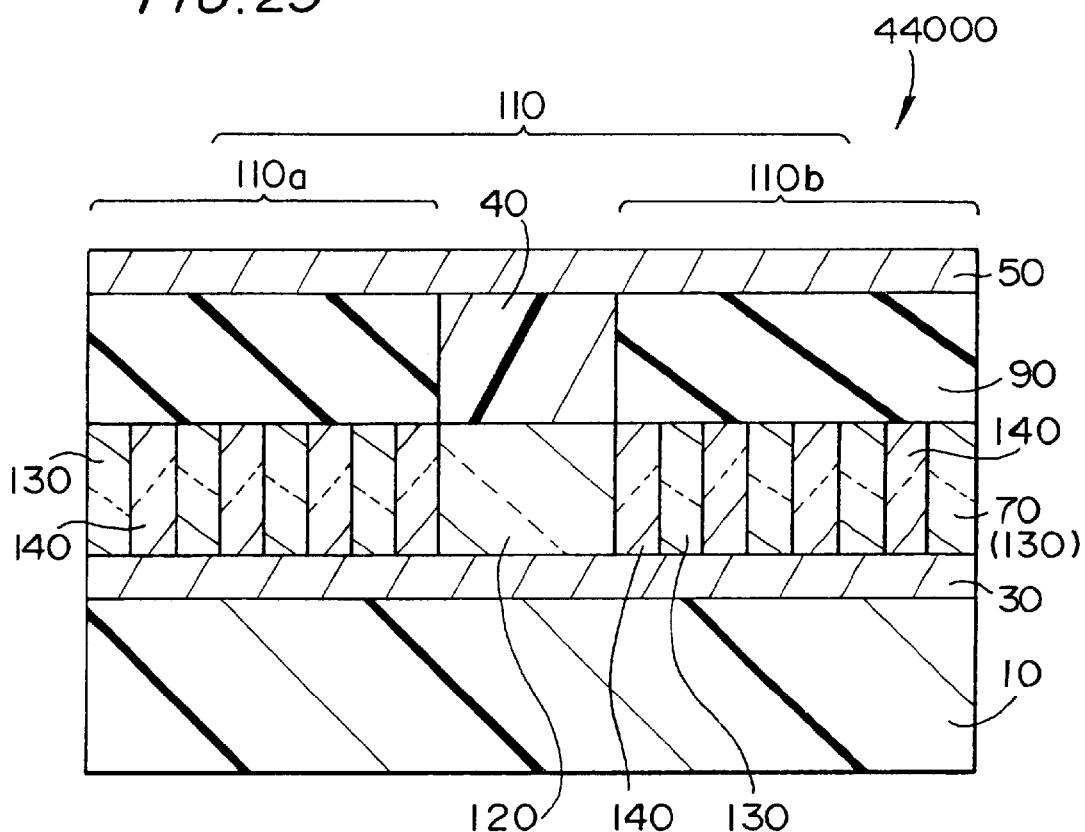
FIG. 23 is a cross-sectional view schematically showing a light-emitting device according to a eighteenth embodiment of the present invention.

FIG. 23 is a cross-sectional view schematically showing a light-emitting device 44000 according to the present embodiment. The light-emitting device 43000 differs from the above-described light-emitting devices 41000, 42000, and 43000 inasmuch as the defect and the organic light-emitting layer are formed in the different areas. The light-emitting device 44000 comprises a substrate 10, anode 30, hole transport layer 70, organic light-emitting layer 40, cathode 50, and grating 110. The anode 30 and the cathode 50 are continuously formed and the hole transport layer 70 is formed discontinuously.

The grating 110 comprises a defect 120 and first and second gratings 110a and 110b at each side of the defect 120. These gratings 110a and 110b can form a photonic band gap to a prescribed wavelength range. First medium layers 130 and second medium layers 140 having different refractive indices are arranged alternately in the gratings 110a and 110b. The defect 120 and the first medium layers 130 are formed by the hole transport layer 70. The second medium layers 140 have insulating properties. The materials for the second medium layers 140 are not limited insofar as the second medium layers 140 can form a photonic band gap by periodic distribution with the first medium layer 130 which serves as the hole transport layer 70. The defect 120 is formed so that the energy level caused by the vacancy exists inside the emission spectrum of the organic light-emitting layer 40 by electrically pumping.

The organic light-emitting layer 40 is formed on the hole transport layer 70 which serves as the defect 120 and stands between the hole transport layer 70 and the cathode 50. In the present embodiment, the defect 120 of the grating 110 is formed in an area different from the light-emitting layer 40. Because the defect 120 of the grating 110 also serves as the hole transport layer 70 in this embodiment, the organic light-emitting layer 40 and the defect 120 are formed so that parts of them are in contact. An insulating layer 90 is formed between the grating 110 and the cathode 50 at each side of the organic light-emitting layer 40.

When a voltage is applied to the anode 30 and the cathode 50, an electric current from the anode 30 and the cathode 50 is concentrated on the hole transport layer 70, which also serves as the defect 120, and the organic light-emitting layer 40 by forming the second medium layers 140 having insulation properties and the insulating layer 90.

The action and the effect of the light-emitting device 44000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

(Nineteenth Embodiment)

Figure 24:
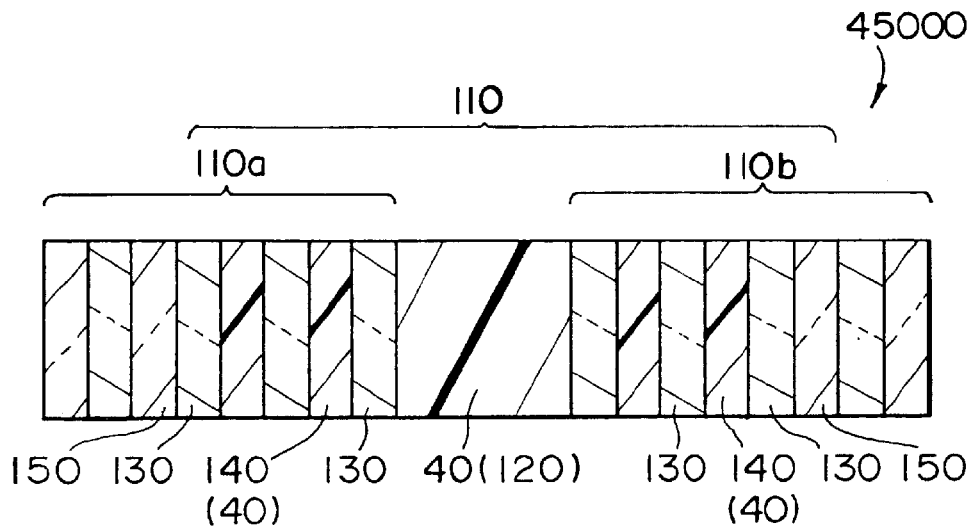
FIG. 24 is a cross-sectional view schematically showing a light-emitting device according to a nineteenth embodiment of the present invention.

FIG. 24 is a cross-sectional view schematically showing a grating 110 in a light-emitting device 45000 according to the present embodiment. This embodiment illustrates a modification of the grating 110. The organic light-emitting layer 40 is embedded into only the defect 120 of the grating 110 in the fifteenth to seventeenth embodiments. In this embodiment, the organic light-emitting layer 40 constitutes not only the defect 120 but also part of the medium layers of the grating 110. The second medium layers 140 in the area close to the defect 120 are formed by filling in the materials for the organic light-emitting layer 40. The organic light-emitting layer can be formed more easily by forming the organic light-emitting layer 40 over a wider area including the defect 120.

The grating 110 comprises a defect 120 and first and second gratings 110a and 110b at both sides of the defect 120. These gratings 110a and 110b can form a photonic band gap in a prescribed wavelength range. First medium layers 130, second medium layers 140, and third medium layers 150 each having different refractive indices are arranged alternately in the gratings 110a and 110b. The organic light-emitting layer 40 is formed in the defect 120. The first medium layers 130 and the second medium layers 140 comprising the organic light-emitting layer 40 are arranged alternately near the defect 120, and at both sides thereof the first medium layers 130 and the third medium layers 150 are arranged alternately. The materials for the first medium layer 130 and the third medium layer 150 are limited insofar as these at least these layers can form a photonic band gap by periodic distribution. The defect 120 is formed so that the energy level caused by the vacancy exists inside the emission spectrum of the organic light-emitting layer 40 by electrically pumping.

The grating 110 shown in FIG. 24 is an example of a grating. This grating can be applied to the light-emitting devices according to the fifteenth to seventeenth embodiments as well as light-emitting devices having other configurations.

Among the embodiments described below, the twentieth to twenty-third embodiments illustrate the case where an organic light-emitting layer constitutes a medium layer of a grating.

(Twentieth Embodiment)

Figure 25:
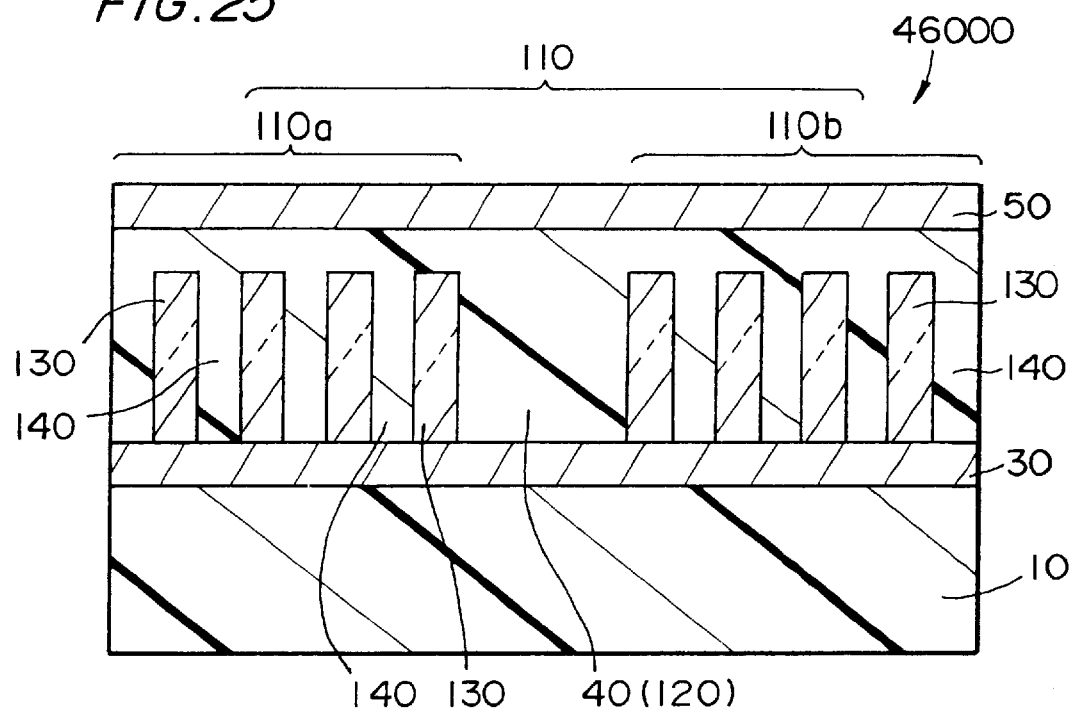
FIG. 25 is a cross-sectional view schematically showing a light-emitting device according to a twentieth embodiment of the present invention.

FIG. 25 is a cross-sectional view schematically showing a light-emitting device 46000 according to the present embodiment. The light-emitting device 46000 comprises a substrate 10, anode 30, organic light-emitting layer 40, cathode 50, and grating 110.

The grating 110 comprises a defect 120 and first and second gratings 110a and 110b at both sides of the defect 120. These gratings 110a and 110b can form a photonic band gap to a prescribed wavelength range. First medium layers 130 and a second medium layer 140 having different refractive indices are arranged alternately in the gratings 110a and 110b. The second medium layer 140 is formed of the organic light-emitting layer 40. The materials for the first medium layers 130 are not limited insofar as the first medium layers 130 can form a photonic band gap by periodic distribution with the second medium layer 140.

The organic light-emitting layer 40 is embedded into the defect 120 and the area where the second medium layers 140 is formed and the upper part thereof are continuous. The defect 120 is formed so that the energy level caused by the vacancy exists inside the emission spectrum of the organic light-emitting layer 40 by electrically pumping.

In this embodiment, the organic light-emitting layer 40 functions as the defect 120 and the second medium layers 140 of the grating 110. These layers can be easily formed by continuously forming the organic light-emitting layer. This also applies to the following twenty-first to twenty-second embodiments.

The action and the effect of the light-emitting device 46000 will be described below.

Electrons and holes are introduced into the organic light-emitting layer 40 respectively from the cathode 50 and the anode 30 by applying a prescribed voltage to both the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

In this embodiment, the anode 30 and cathode 50 may be formed only in the area corresponding the defect 120 formed from the organic light-emitting layer 40. The efficiency of current injection into the light-emitting layer 40 can be improved by forming the electrodes in such a manner. This also applies to other embodiments having a grating which constitutes a photonic band gap.

(Twenty-first Embodiment)

Figure 26:
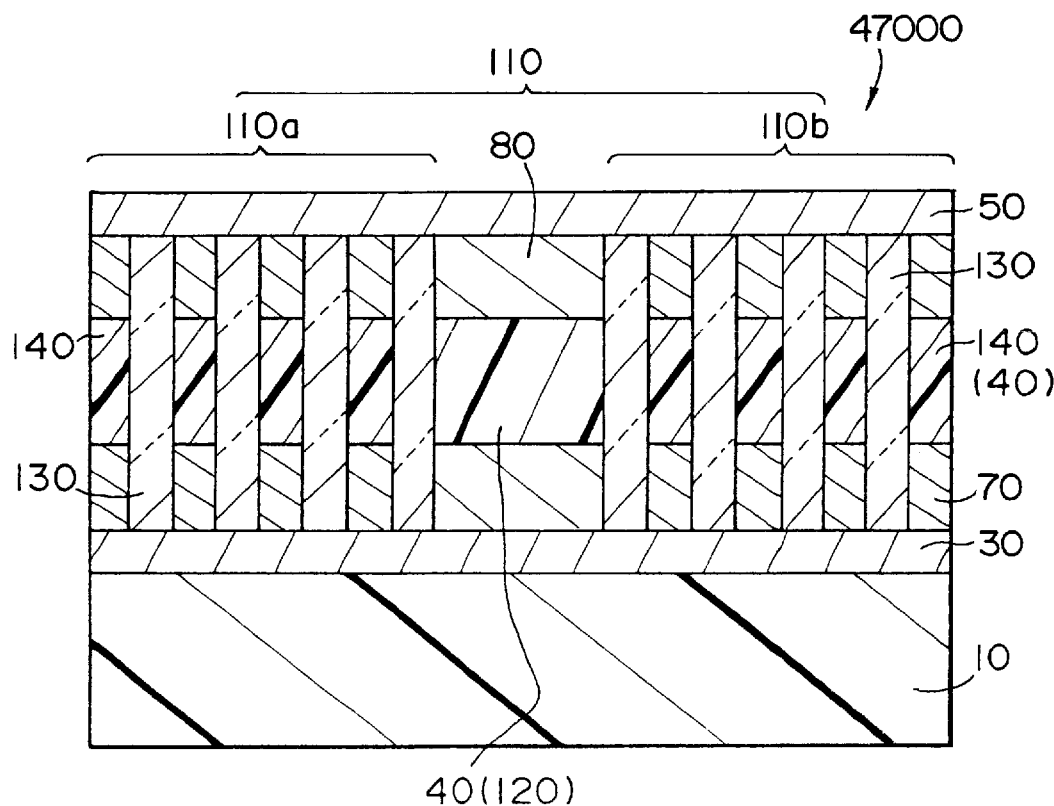
FIG. 26 is a cross-sectional view schematically showing a light-emitting device according to a twenty-first embodiment of the present invention.

FIG. 26 is a cross-sectional view schematically showing a light-emitting device 47000 according to the present embodiment. The light-emitting device 47000 comprises a substrate 10, anode 30, hole transport layer 70, organic light-emitting layer 40, electron transport layer 80, cathode 50, and grating 110. The anode 30 and the cathode 50 are continuously formed. The hole transport layer 70 and the electron transport layer 80 are formed discontinuously.

The grating 110 comprises a defect 120 and the organic light-emitting layer 40 is formed in the defect 120. First and second gratings 110a and 110b are formed at both sides of the defect 120. These gratings 110a and 110b can form a photonic band gap in a prescribed wavelength range. First medium layers 130 and second medium layers 140 each of which have a different refractive index are arranged alternately in the gratings 110a and 110b. The first medium layers 130 are formed between the anode 30 and the cathode 50. The second medium layers 140 stand between the hole transport layer 70 and the electron transport layer 80. The first layers 130 has insulating properties. Since the first medium layers 130 has insulating properties, when a voltage is applied to the anode 30 and the cathode 50, an electric current flows efficiently into the organic light-emitting layer 40 formed in the defect 120 through the hole transport layer 40 and the electron transport layer 80. The materials for the first medium layers 130 are not limited insofar as the first medium layers 130 can form a photonic band gap by periodic distribution with the second medium layers 140.

The organic light-emitting layer 40 is embedded into the defect 120. Specifically, the defect 120 of the grating 110 also functions as the light-emitting layer 40 in the present embodiment. The defect 120 is formed so that the energy level caused by the vacancy exists within the emission spectrum of the organic light-emitting layer 40 by electrically pumping.

The action and the effect of the light-emitting device 47000 will be described below.

Electrons are introduced from the cathode 50 through the electron transport layer 80 and holes are introduced from the anode 30 through the hole transport layer 70 into the organic light-emitting layer 40 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

The following twenty-second and twenty-third embodiments illustrate the case where one of the medium layers constituting a photonic band gap is an organic light-emitting layer and a defect is formed by a layer other than the organic light-emitting layer.

(Twenty-second Embodiment)

Figure 27:
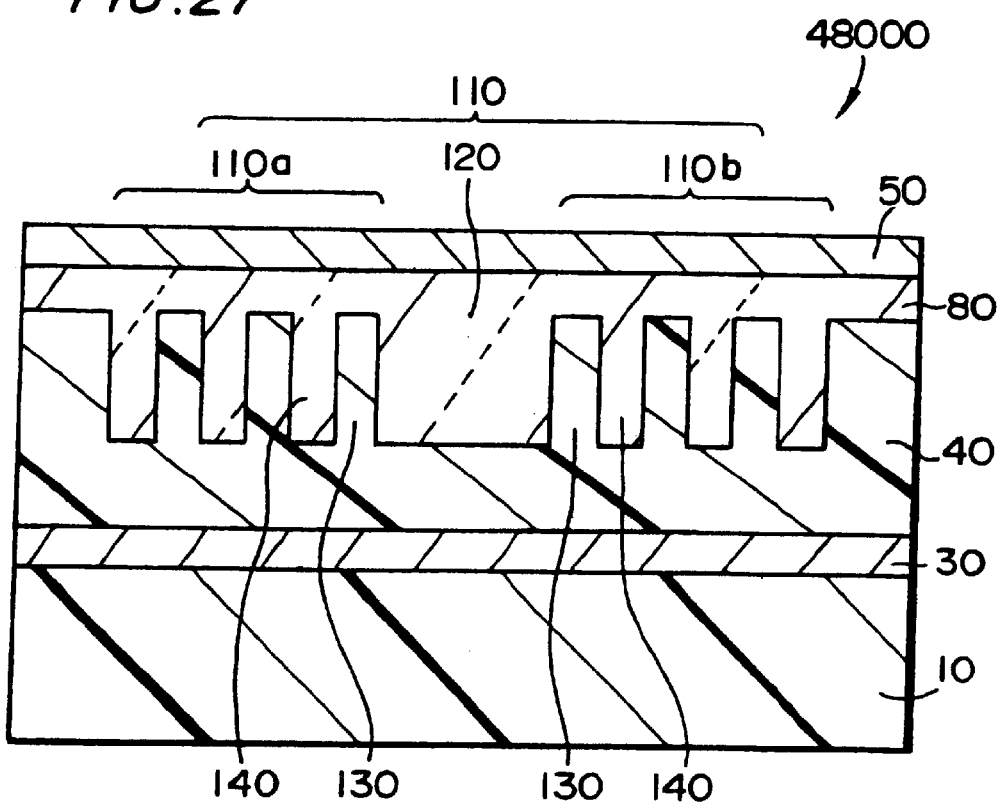
FIG. 27 is a cross-sectional view schematically showing a light-emitting device according to a twenty-second embodiment of the present invention.

FIG. 27 is a cross-sectional view schematically showing a light-emitting device 48000 according to the present embodiment. The light-emitting device 48000 comprises a substrate 10, anode 30, organic light-emitting layer 40, electron transport layer 80, cathode 50, and grating 110. The anode 30, organic light-emitting layer 40, electron transport layer 80, and cathode 50 are continuously formed.

The grating 110 comprises a defect 120 and the electron transport layer 80 is embedded into this defect 120. First and second gratings 110a and 110b are formed at each side of the defect 120. These gratings 110a and 110b can form a photonic band gap in a prescribed wavelength range. First medium layers 130 and second medium layers 140, each of which have a different refractive index, are arranged alternately in the gratings 110a and 110b. The first medium layers 130 are formed from the organic light-emitting layer 40. The second medium layers 140 are formed from the electron transport layer 80. The materials for the first medium layer 130 and the second medium layer 140 are not limited insofar as these materials can function as the organic light-emitting layer and the electron transport layer and form a photonic band gap by periodic distribution of both materials.

The organic light-emitting layer 40 is formed below the electron transport layer 80 which serves as the defect 120 and stands between the electron transport layer 80 and the anode 30. In the present embodiment, the defect 120 of the grating 110 is formed in an area differing from the light-emitting layer 40. Since the defect 120 of the grating 110 also serves as the electron transport layer 80 in this embodiment, the organic light-emitting layer 40 and the defect 120 are formed so as to be in contact in a certain area. The defect 120 is formed so that the energy level caused by the vacancy exists within the emission spectrum of the organic light-emitting layer 40 by electrically pumping.

The action and the effect of the light-emitting device 48000 will be described below.

Electrons are introduced from the cathode 50 through the electron transport layer 80 and holes are introduced from the anode 30 into the organic light-emitting layer 40 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

(Twenty-third Embodiment)

Figure 28:
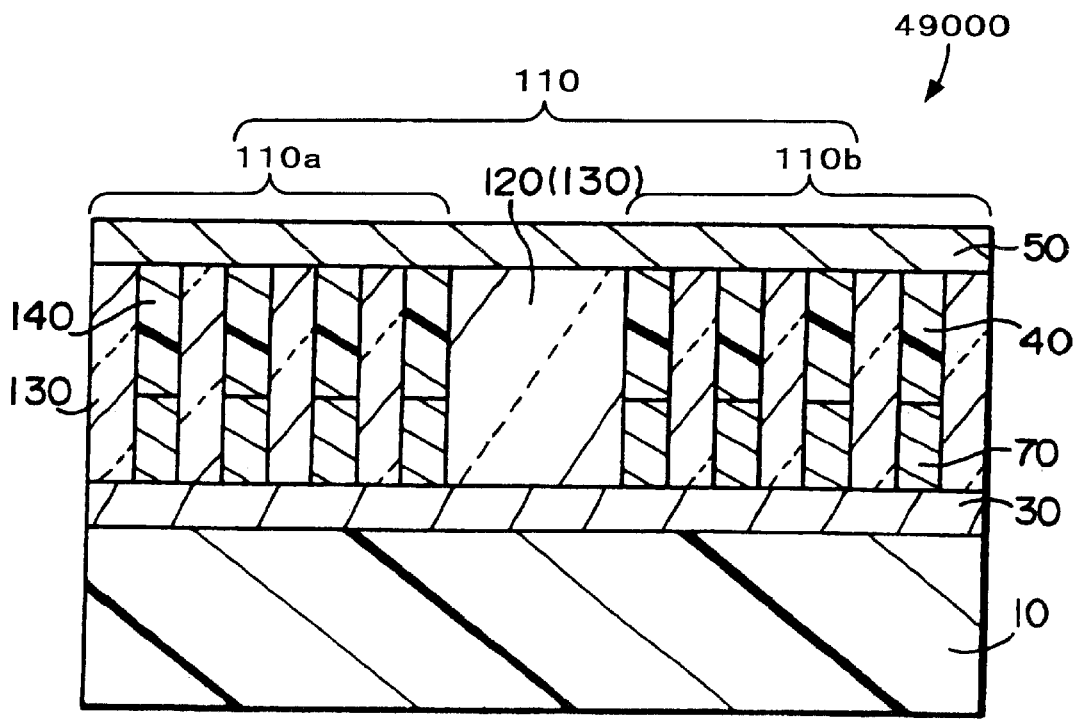
FIG. 28 is a cross-sectional view schematically showing a light-emitting device according to a twenty-third embodiment of the present invention.

FIG. 28 is a cross-sectional view schematically showing a light-emitting device 49000 according to the present embodiment. The light-emitting device 49000 comprises a substrate 10, anode 30, hole transport layer 70, organic light-emitting layer 40, cathode 50, and grating 110. The anode 30 and the cathode 50 are continuously formed. The hole transport layer 70 and the organic light-emitting layer 40 are formed discontinuously.

The grating 110 comprises a defect 120 and the defect 120 is formed from the materials which constitute a first medium layer 130. First and second gratings 110a and 110b are formed at each side of the defect 120. These gratings 110a and 110b can form a photonic band gap in a prescribed wavelength range. The first medium layers 130 and second medium layers 140, each of which have a different refractive index, are arranged alternately in the gratings 110a and 110b. The first medium layers 130 are formed between the anode 30 and the cathode 50. The second medium layers 140 stand between the hole transport layer 70 and the cathode 50. The first medium layers 130 have insulating properties. Since the first medium layers 130 have insulating properties, an electric current is efficiently introduced into only the organic light-emitting layers 40 which constitute the second medium layers 140 through the hole transport layer 70 when a voltage is applied to the anode 30 and the cathode 50. The materials for the first medium layers 130 are not limited insofar as the first medium layers 130 can form a photonic band gap by periodic distribution with the second medium layers 140.

The organic light-emitting layers 40 serve as the second medium layers 140 and stand between the hole transport layer 70 and the cathode 50. The defect 120 serves as the first medium layer 130. Specifically, the defect 120 of the grating 110 of the present embodiment is formed in an area differing from the light-emitting layer 40. The defect 120 is formed so that the energy level caused by the vacancy exists within the emission spectrum of the organic light-emitting layer 40 by electrically pumping.

The action and the effect of the light-emitting device 49000 will be described below.

Electrons and holes are introduced into the organic light-emitting layer 40 respectively from the cathode 50 and the anode 30 through the hole transport layer 70 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

The following twenty-fourth embodiment illustrates the case where an organic light-emitting layer is formed by a layer different from a grating.

(Twenty-fourth Embodiment)

Figure 29:
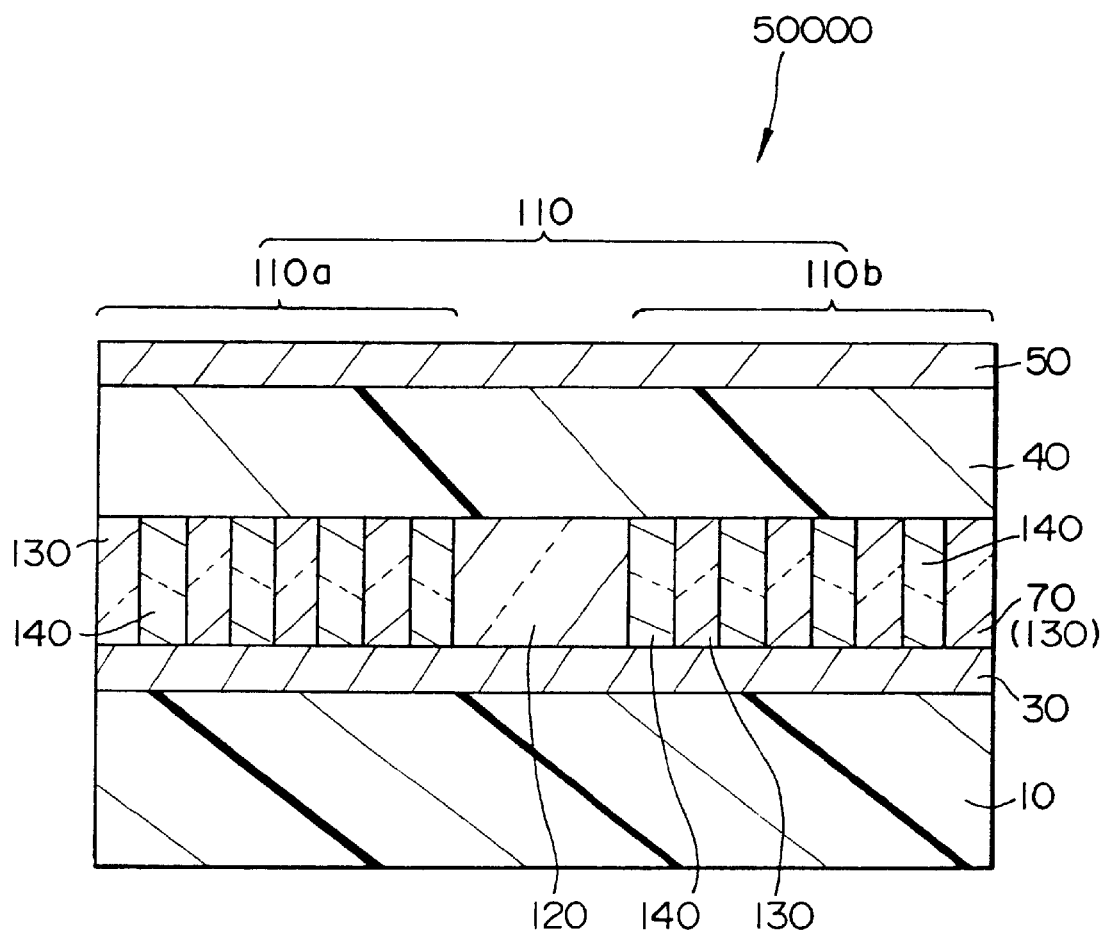
FIG. 29 is a cross-sectional view schematically showing a light-emitting device according to a twenty-fourth embodiment of the present invention.

FIG. 29 is a cross-sectional view schematically showing a light-emitting device 50000 according to the present embodiment. The light-emitting device 50000 comprises a substrate 10, anode 30, hole transport layer 70, organic light-emitting layer 40, cathode 50, and grating 110. The anode 30, organic light-emitting layer 40, and cathode 50 are continuously formed. The hole transport layer 70 is formed discontinuously.

The grating 110 comprises a defect 120 and first and second gratings 110a and 110b at each side of the defect 120. These gratings 110a and 110b can form a photonic band gap in a prescribed wavelength range. The first medium layers 130 and second medium layers 140, each of which have a different refractive index, are arranged alternately in 5 the gratings 110a and 110b. The defect 120 and the first medium layer 130 are formed by the hole transport layer 70. The second medium layer 140 has insulating properties. The materials for the second medium layers 140 are not limited insofar as the second medium layers 140 can form a photonic band gap by periodic distribution with the first medium layer 130 which serves as the hole transport layer 70. The defect 120 is formed so that the energy level caused by the vacancy exists within the emission spectrum of the organic light-emitting layer 40 by electrically pumping.

The organic light-emitting layer 40 is formed on the hole transport layer 70 which serves as the defect 120 and stands between the grating 110 and the cathode 50. Specifically, the defect 120, of the grating 110 of the present embodiment is formed in an area differing from the organic light-emitting layer 40.

The action and the effect of the light-emitting device 50000 will be described below.

Electrons and holes are introduced into the organic light-emitting layer 40 respectively from the cathode 50 and the anode 30 through the hole, transport layer 70 by applying a prescribed voltage to the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

(Twenty-fifth Embodiment)

Figure 30:
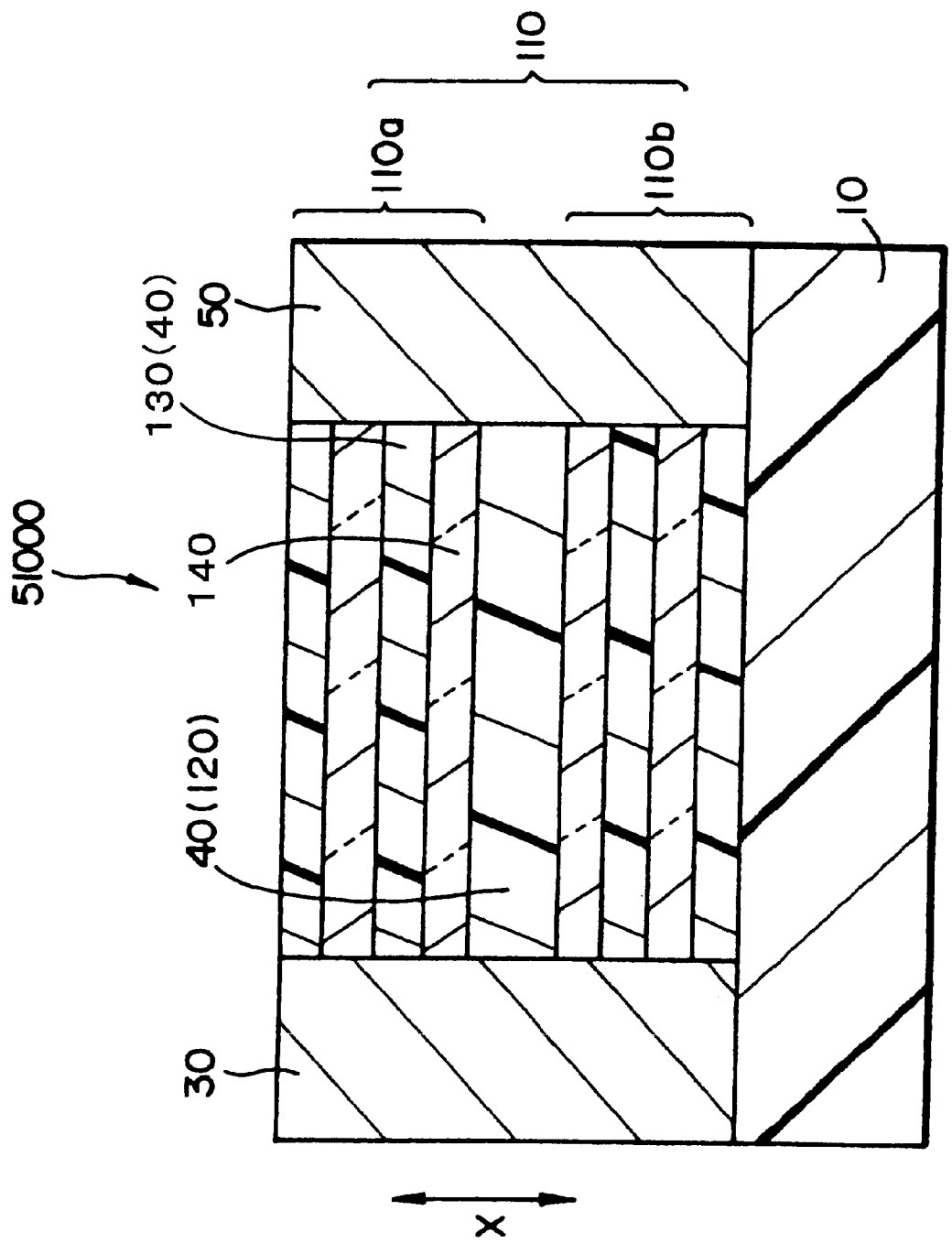
FIG. 30 is a cross-sectional view schematically showing a light-emitting device according to a twenty-fifth embodiment of the present invention.

FIG. 30 is a cross-sectional view schematically showing a light-emitting device 51000 according to the present embodiment. In the light-emitting device 51000, a grating is formed in the direction different from that in the above-described embodiments. The light-emitting device 51000 comprises a substrate 10, anode 30, organic light-emitting layer 40, cathode 50, and grating 110. The grating 110 is formed perpendicular to the substrate 10.

The grating 110 comprises a defect 120 and first and second gratings 110a and 110b at each side of the defect 120. These gratings 110a and 110b can form a photonic band gap in a prescribed wavelength range. The first medium layers 130 and second medium layers 140, each of which have a different refractive index, are arranged alternately in the gratings 110a and 110b. The first medium layers 130 are formed by the organic light-emitting layer 40. The materials for the second medium layers 140 are not limited insofar as the second medium layers 140 can form a photonic band gap by periodic distribution with the first medium layer 130.

The organic light-emitting layer 40 is embedded into the defect 120. Specifically, the defect 120 of the grating 110 also functions as the light-emitting layer 40 in the present embodiment. The defect 120 is formed so that the energy level caused by the vacancy exists within the emission spectrum of the organic light-emitting layer 40 by electrically pumping.

The anode 30 and the cathode 50 are formed perpendicular to the substrate 10.

The action and the effect of the light-emitting device 51000 will be described below.

Electrons and holes are introduced into the organic light-emitting layer 40 respectively from the cathode 50 and the anode 30 by applying a prescribed voltage to both the anode 30 and the cathode 50. Excitons are formed in the organic light-emitting layer 40 by recombination of these electrons and holes. Therefore, light with a remarkably narrow emission spectrum width prescribed by the width of the energy level caused by the vacancy can be obtained with high efficiency by the photonic band gap of the grating 110.

The present invention is not limited to the above-described embodiments and many modifications and variations are possible within the scope of the present invention.

For example, some of the above embodiments comprise a pair of cladding layers. However, if other layers such as the electrode layer made from metals can confine light, the cladding layers may be omitted. Moreover, the above embodiments illustrate light-emitting devices comprising an organic light-emitting layer as a light-emitting layer. A light-emitting layer comprising inorganic materials may be used instead of such an organic light-emitting layer.

As described above, the present invention can provide a light-emitting device with a narrow spectral width of emission wavelength and excellent directivity.

What is claimed is:

1. A light-emitting device comprising:
a first cladding layer;
a first electrode layer formed above the first cladding layer;
a light-emitting layer that emits light by electroluminescence and formed above the first electrode layer;
a second electrode layer formed above the light-emitting layer;
a second cladding layer formed above the second electrode layers; and
a grating formed further inside between the first and second cladding layer.

2. The light-emitting device according to claim 1 further comprising:
a core layer formed between the first cladding layer and the first electrode layer, wherein the grating is formed in the core layer.

3. The light-emitting device according to claim 1 further comprising:
a core layer formed between the first cladding layer and the first electrode layer,
wherein the grating is formed at a boundary area between the core layer and the first cladding layer.

4. The light-emitting device according to claim 1 further comprising:
at least one of a first transport layer formed between the light-emitting layer and the first electrode layer and a second transport layer being formed between the light-emitting layer and the second electrode layer.

5. The light-emitting device according to claim 4, wherein the grating is formed in one of the first and second transport layers.

6. The light-emitting device according to claim 4, wherein the grating is formed at a boundary area between one of the adjacent first and second transport layers and one of the first and second electrode layers.

7. The light-emitting device according to claim 4, wherein the grating is formed at a boundary area between the first transport layer or second transport layer and the light-emitting layer.

8. The light-emitting device according to claim 1, wherein the light-emitting layer constitutes one medium of the grating and is formed by layers that are discontinuously arranged.

9. The light-emitting device according to claim 8, wherein the grating is formed by the light-emitting layer and one of the first and second transport layers.

10. The light-emitting device according to claim 8, wherein the grating is formed by the light-emitting layer and one of the first and second electrode layers.

11. The light-emitting device according to claim 8, wherein the grating is formed by the light-emitting layer and an insulating medium layer.

12. A light-emitting device comprising:
a cladding layer;
a first electrode layer formed above the cladding layer;
a light-emitting layer that emits light by electroluminescence and formed above the first electrode layer;
a second electrode layer formed above the light-emitting layer; and
a grating formed further inside between the cladding layer and the second electrode layer.

13. The light-emitting device according to claim 12, wherein the second electrode layer is a cathode.

14. The light emitting device according to claim 12, further comprising:
at least one of a first transport layer being formed between the light-emitting layer and the first electrode layer and a second transport layer being formed between the light-emitting layer and the second electrode layer.

15. The light-emitting device according to claim 14, wherein the grating is formed by the light-emitting layer and first transport layer or second transport layer.

16. A light-emitting device comprising:
a cladding layer;
a first electrode layer formed above the cladding layer;
a light emitting layer that emits light by electroluminescence and formed partly above the first electrode layer;

a second electrode layer formed above the light-emitting layer;

at least one of a first transport layer formed between the light-emitting layer and the first electrode layer and a second transport layer formed between the light-emitting layer and the second electrode layer; and a grating formed further inside between the cladding layer and the second electrode layer.

17. The light-emitting device according to claim 16, wherein the light-emitting layer is formed in a concave portion of one of the first and second transport layers, and wherein the grating is formed by the one of the first and second transport layers and air.

18. The light-emitting device according to claim 16, wherein the grating is formed by one of the first and second transport layers and an insulating medium layer.

19. A light-emitting device comprising:

an EL element section in which a plurality of layers are formed in concentric circles;

an optical fiber section;

wherein the EL element section comprises:
a first core layer;
a first electrode layer formed at an exterior of the first core layer;
a light-emitting layer that emits light by electroluminescence and formed at an exterior of the first electrode layer;
a second electrode layer formed at an exterior of the light-emitting layer;
a first cladding layer formed at an exterior of the second electrode layer;
a grating formed in the first core layer, wherein the optical fiber section comprises:
a second core layer; and
a second cladding layer formed at an exterior of the second core layer, wherein the first core layer of the EL element section and the second core layer of the optical fiber section are formed on an identical axis.

20. The light-emitting device according to claim 19, wherein the first core layer comprises first medium layers and second medium layers each of which is provided alternately, and wherein the grating is formed by the first and second medium layers.

21. The light-emitting device according to claim 19, wherein the first and second core layers continue integrally, and wherein the grating is formed by the first core layer and the first electrode layer.

22. The light-emitting device according to claim 19, wherein the first and second core layers continue integrally, and wherein the grating is formed by the first electrode layer and a medium layer.

23. A light-emitting device comprising:

an EL element section; and an optical fiber section, wherein the EL element section comprises:
a first core layer having a plane surface;
a first electrode layer being formed above the plane surface of the first core layer;
a light-emitting layer that emits light by electroluminescence and formed above the first electrode layer;
a second electrode layer formed above the light-emitting layer;
a first cladding layer formed at an exterior of the first core layer;

a second cladding layer formed at an exterior of the first electrode layer, the light-emitting layer and the second electrode layer; and a grating formed in the first core layer, wherein the optical fiber section comprises:
a second core layer; and
a third cladding layer formed at an exterior of the second core layer, wherein the first core layer of the EL element section and the second core layer of the optical fiber section are formed on an identical axis.

24. The light-emitting device according to claim 23, wherein the first core layer comprises first and second medium layers provided alternately, and wherein the grating is formed by the first and second medium layers.

25. A light-emitting device comprising:

a substrate;

a first electrode layer formed above the substrate;

an organic light-emitting layer that emits light by current excitation and formed above the first electrode layer;

a second electrode layer formed above the organic light-emitting layer; and a grating formed further inside between the substrate and the second electrode layer, wherein the grating has:
a one-dimensional periodic refractive index distribution which constitutes a photonic band gap; and
a defect which is designed so that the energy level caused by a vacancy is within a specific emission spectrum.

26. The light-emitting device according to claim 25 further comprising:

at least one of a first transport layer formed between the organic light-emitting layer and the first electrode layer and a second transport layer formed between the organic light-emitting layer and the second electrode layer.

27. The light-emitting device according to claim 26, wherein the organic light-emitting layer is formed in a concave portion of one of the first and second transport layers and constitutes the defect, and wherein the grating is formed by a medium layer and one of the first and second transport layers.

28. The light-emitting device according to claim 26, wherein the organic light-emitting layer is formed between the first and second transport layers and constitutes the defect, and wherein the grating is formed by first and second medium layers.

29. The light-emitting device according to claim 26, wherein the organic light-emitting layer is formed between one of the adjacent first and second transport layers and one of the first and second electrode layers and constitutes the defect, and wherein the grating is formed by first and second medium layers.

30. The light-emitting device according to claim 26, wherein the organic light-emitting layer is formed between one of the adjacent first and second transport layers and one of the first and second electrode layers, and wherein the grating is formed by first and second medium layers and the defect is formed by one of the first and second medium layers.

31. The light-emitting device according to claim 25, wherein the organic light-emitting layer constitutes the defect, wherein the grating near the defect constitutes one of first and second medium layers formed from a same material as the organic light-emitting layer, and wherein other parts of the grating are formed by the first and second medium layers.

32. The light-emitting device according to claim 25, wherein the grating is formed by the organic light-emitting layer and a medium layer.

33. The light-emitting device according to claim 26, wherein the grating is formed by the organic light-emitting layer and one of the first and second transport layers.

34. The light-emitting device according to claim 25, wherein the grating is formed by the organic light-emitting layer and a medium layer, and wherein the defect is formed by the medium layer.

35. The light-emitting device according to claim 26, wherein the grating is formed by a medium layer and one of the first and second transport layers, and wherein the defect is formed by the medium layer.

36. A light-emitting device comprising:

a substrate;

a first grating formed above the substrate;

an organic light-emitting layer that emits light by current excitation and formed above the first grating;

a second grating formed above the organic light-emitting layer; and first and second electrode layers formed at either ends of the first grating, the organic light-emitting layer and the second grating, wherein the first and second gratings have:

a one-dimensional periodic refractive index distribution which constitutes photonic band gap; and a defect which is designed so that the energy level caused by a vacancy is within a specific emission spectrum.

37. The light-emitting device according to claim 36, wherein the organic light-emitting layer constitutes the defect, and wherein the first and second gratings are formed by the organic light-emitting layer and a medium layer.

* * * * *